(12) United States Patent
Wu et al.

(10) Patent No.: US 9,935,173 B1
(45) Date of Patent: Apr. 3, 2018

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventors: Chung-Chiang Wu, Taichung (TW); Chia-Ching Lee, New Taipei (TW); Hsueh-Wen Tsau, Zhunan Township, Miaoli County (TW); Chun-Yuan Chou, Taipei (TW); Ching-Hwanq Su, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/363,455

(22) Filed: Nov. 29, 2016

(51) Int. Cl.
| | | |
|---|---|---|
| *H01L 21/8234* | (2006.01) | |
| *H01L 29/49* | (2006.01) | |
| *H01L 29/08* | (2006.01) | |
| *H01L 29/161* | (2006.01) | |
| *H01L 29/165* | (2006.01) | |
| *H01L 29/24* | (2006.01) | |
| *H01L 29/267* | (2006.01) | |
| *H01L 29/78* | (2006.01) | |

(Continued)

(52) U.S. Cl.
CPC .... *H01L 29/4966* (2013.01); *H01L 21/28088* (2013.01); *H01L 21/76254* (2013.01); *H01L 21/823431* (2013.01); *H01L 21/823437* (2013.01); *H01L 29/0649* (2013.01); *H01L 29/0847* (2013.01); *H01L 29/161* (2013.01); *H01L 29/165* (2013.01); *H01L 29/24* (2013.01); *H01L 29/267* (2013.01); *H01L 29/66545* (2013.01); *H01L 29/66636* (2013.01); *H01L 29/66795* (2013.01); *H01L 29/785* (2013.01); *H01L 29/7848* (2013.01)

(58) Field of Classification Search
CPC . H01L 21/71; H01L 21/8232; H01L 27/11896
See application file for complete search history.

(56) References Cited

U.S. PATENT DOCUMENTS

| | | |
|---|---|---|
| 7,667,271 B2 | 2/2010 | Yu et al. |
| 8,362,575 B2 | 1/2013 | Kwok et al. |

(Continued)

*Primary Examiner* — Cheung Lee
(74) *Attorney, Agent, or Firm* — Birch, Stewart, Kolasch & Birch, LLP

(57) ABSTRACT

Structures and formation methods of a semiconductor device structure are provided. A method for forming a semiconductor device structure includes patterning a semiconductor substrate to form a fin structure. The method also includes forming a sacrificial material over the fin structure. The method further includes forming spacer elements adjoining sidewalls of the sacrificial material. Furthermore, the method includes removing the sacrificial material so that a trench is formed between the spacer elements. The method also includes forming a gate dielectric layer in the trench. The method further includes forming a work function layer in the trench to cover the gate dielectric layer. In addition, the method includes depositing a tungsten bulk layer with a precursor to fill the trench. The precursor includes a tungsten-containing material that is substantially free of fluoride.

20 Claims, 21 Drawing Sheets

(51) Int. Cl.
    *H01L 29/66*     (2006.01)
    *H01L 21/28*     (2006.01)
    *H01L 21/762*     (2006.01)
    *H01L 29/06*     (2006.01)

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2011/0068407 A1 | 3/2011 | Yeh et al. |
| 2013/0011983 A1 | 1/2013 | Tsai et al. |
| 2014/0252412 A1 | 9/2014 | Tsai et al. |
| 2015/0270177 A1* | 9/2015 | Tseng ............... H01L 21/82385 438/216 |
| 2015/0348840 A1* | 12/2015 | Bamnolker ....... H01L 21/28556 438/669 |

\* cited by examiner

STRUCTURE AND FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
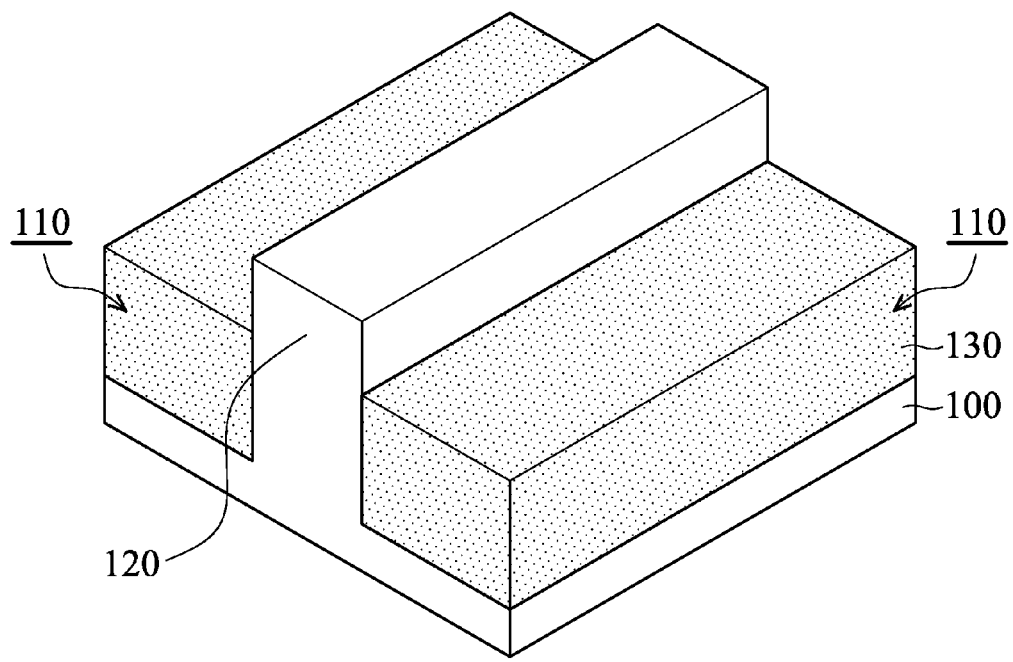
FIGS. 1A-1J are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1J are perspective views of various stages of a process for forming a semiconductor device structure, in accordance with some embodiments. FIGS. 2A-2F are cross-sectional views of various stages of a process for forming a semiconductor device structure, in accordance with some embodiments. Additional operations can be provided before, during, and/or after the stages described in FIGS. 1A-1J and FIGS. 2A-2F. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 1A, multiple recesses (or trenches) 110 are formed in the semiconductor substrate 100, in accordance with some embodiments. As a result, multiple fin structures 120 are formed between the recesses 110. As shown in FIG. 1A, one of the fin structures 120 is shown.

In some embodiments, one or more photolithography and etching processes are used to form the fin structures 120 between the recesses 110. In some embodiments, a hard mask (not shown) is formed over the semiconductor substrate 100 to assist in the patterning process for forming the fin structures 120. In some embodiments, the hard mask includes silicon oxide, silicon nitride, silicon oxynitride, silicon carbide, another suitable material, or a combination thereof.

In some embodiments, a hard mask layer is deposited over the semiconductor substrate 100 by using suitable deposition methods. The suitable deposition methods may include a chemical vapor deposition (CVD) process, an atomic layer deposition (ALD) process, a thermal oxidation process, a physical vapor deposition (PVD) process, another applicable process, or a combination thereof. Afterwards, a photolithography process and an etching process are performed to pattern the hard mask layer to form the hard mask. With the assistance of the hard mask, the semiconductor substrate 100 is etched and patterned. As a result, the fin structures 120 between the recesses 110 are formed.

As shown in FIG. 1A, isolation features 130 are formed in the recesses 110 to surround lower portions of the fin structures 120, in accordance with some embodiments. The isolation features 130 are used to define and electrically isolate various device elements formed in and/or over the semiconductor substrate 100. In some embodiments, the isolation features 130 include shallow trench isolation (STI) features, local oxidation of silicon (LOCOS) features, other suitable isolation features, or a combination thereof.

In some embodiments, the isolation features 130 are made of a dielectric material. The dielectric material may include silicon oxide, silicon nitride, silicon oxynitride, spin-on glass, low-K dielectric material, another suitable material, or a combination thereof. In some embodiments, each of the isolation features 130 has a multi-layer structure.

In some embodiments, an STI liner (not shown) is formed to reduce defects at the interface between the semiconductor substrate 100 and the isolation features 130. Similarly, the STI liner may also be used to reduce defects at the interface between the fin structures 120 and the isolation features 130.

In some embodiments, a dielectric material layer is deposited over the semiconductor substrate 100. The dielectric material layer covers the fin structures 120 and fills the recesses 110 between the fin structures 120. In some embodiments, the dielectric material layer is deposited using a CVD process, a spin-on process, another applicable process, or a combination thereof. In some embodiments, a planarization process is performed to thin down the dielectric material layer until the top surfaces of the fin structures 120 are exposed. The planarization process may include a chemical mechanical polishing (CMP) process, a grinding process, an etching process, another applicable process, or a combination thereof. Afterwards, the dielectric material layer is etched back to form the isolation features 130. The fin structures 120 protrude from the isolation features 130, as shown in FIG. 1A in accordance with some embodiments.

Figure 1B:
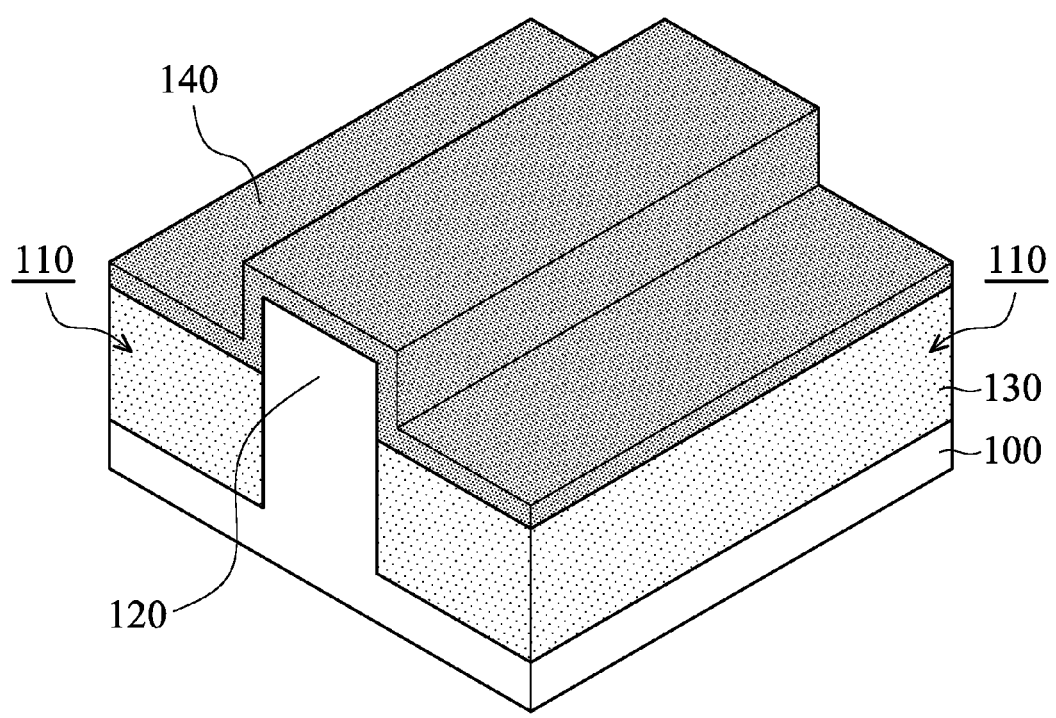

As shown in FIG. 1B, a dielectric layer 140 is deposited over the semiconductor substrate 100, in accordance with some embodiments. The dielectric layer 140 covers the fin structures 120 and the isolation features 130. In some embodiments, the dielectric layer 140 extends over the fin structures 120 and the isolation features 130 conformally.

In some embodiments, the dielectric layer 140 is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the dielectric layer 140 is deposited using a CVD process, an ALD process, a thermal oxidation process, a PVD process, another applicable process, or a combination thereof. In some embodiments, one or more portions of the dielectric layer 140 are sacrificial or dummy gate dielectric layers which will be removed in a subsequent process.

Figure 1C:
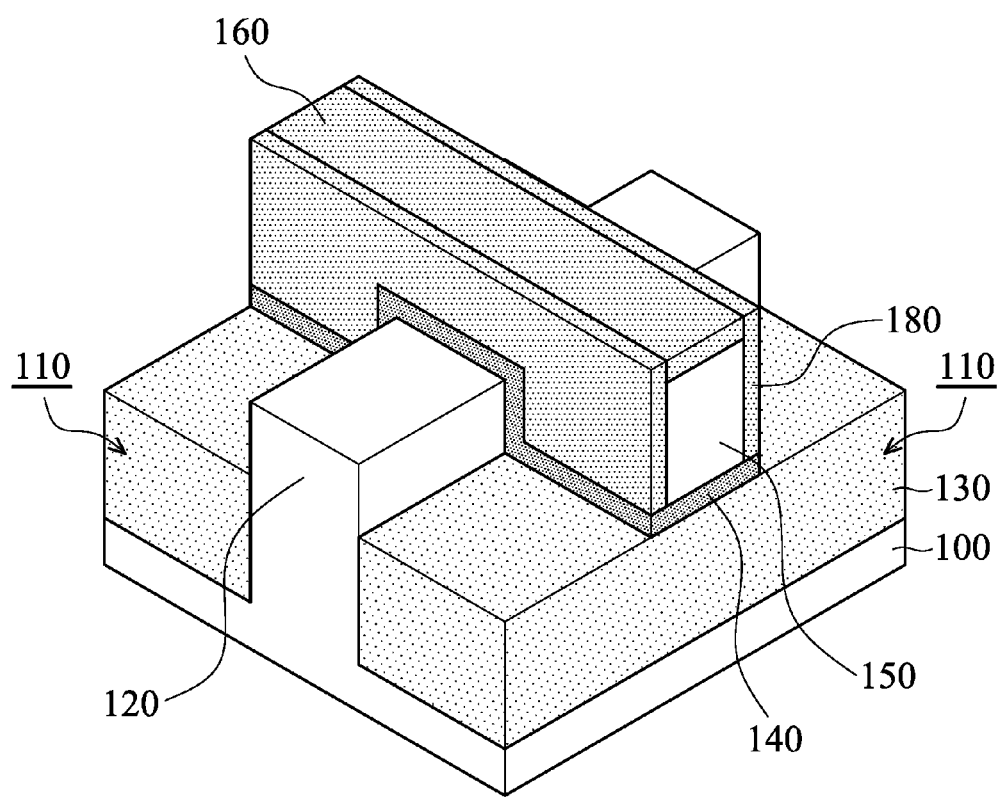

As shown in FIG. 1C, a gate electrode 150 and a hard mask 160 are formed over the dielectric layer 140, in accordance with some embodiments. In some embodiments, the gate electrode 150 includes polysilicon, a metal material, another suitable conductive material, or a combination thereof. In some embodiments, the gate electrode 150 is a sacrificial or dummy gate electrode layer and will be replaced with another conductive material such as a metal material. The sacrificial gate electrode layer is made of a sacrificial material, for example, polysilicon.

In some embodiments, the hard mask 160 is over the gate electrode 150. The hard mask 160 may be used to assist in the patterning process for forming the gate electrode 150. In some embodiments, the hard mask 160 includes silicon oxide, silicon nitride, silicon oxynitride, silicon carbide, another suitable material, or a combination thereof. In some embodiments, the hard mask 160 has a multi-layer structure.

In some embodiments, a gate electrode layer and a hard mask layer are deposited over the dielectric layer 140. In some embodiments, the gate electrode layer, and the hard mask layer are sequentially deposited by using suitable deposition methods. The suitable deposition methods may include a CVD process, an ALD process, a thermal oxidation process, a PVD process, another applicable process, or a combination thereof. Afterwards, a photolithography process and an etching process are performed to pattern the hard mask layer to form the hard mask 160. With the assistance of the hard mask 160, the gate electrode layer is etched and patterned. As a result, the gate electrode 150 is formed.

As shown in FIG. 1C, spacer elements 180 are formed over sidewalls of the gate electrode 150 and the hard mask 160, in accordance with some embodiments. The spacer elements 180 may be used to assist in the formation of source and drain structures (or regions) in subsequent processes.

In some embodiments, the spacer elements 180 are made of silicon nitride, silicon oxynitride, silicon carbide, another suitable material, or a combination thereof. In some embodiments, a spacer layer is deposited over the dielectric layer 140. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate electrode 150 and the hard mask 160 form the spacer elements 180.

Many variations and/or modifications can be made to embodiments of the disclosure. In some other embodiments, the spacer elements 180 are not formed.

As shown in FIG. 1C, one or more portions of the dielectric layer 140 are removed, in accordance with some embodiments. As a result, the fin structures 120 and the isolation features 130 are partially exposed. Some portions of the dielectric layer 140, which are below the gate electrode 150, the hard mask 160 and the spacer elements 180, remain over the semiconductor substrate 100. In some embodiments, the sidewalls of the dielectric layer 140 that remains are substantially coplanar with the outer sidewalls of the spacer elements 180.

In some embodiments, an etching process is used to remove one or more portions of the dielectric layer 140. In some embodiments, the etching process includes a dry etching process, a wet etching process or another suitable etching process. In some embodiments, the gate electrode 150, the hard mask 160 and the spacer elements 180 are used as an etching mask during the partial removal of the dielectric layer 140. In some other embodiments, another hard mask (not shown) is used to assist in the partial removal of the dielectric layer 140.

In some embodiments, the gate electrode 150 and the dielectric layer 140, which remains covered by the gate electrode 150, together form a gate stack. In some embodiments, the gate stack is a sacrificial or dummy gate stack and will be replaced with a metal gate stack. In some embodiments, the gate stack surrounds side surfaces and a top surface of one or more of the fin structures 120. In some embodiments, the gate stack extends in the recesses 110 between the fin structures 120 and over the isolation features 130.

Figure 1D:
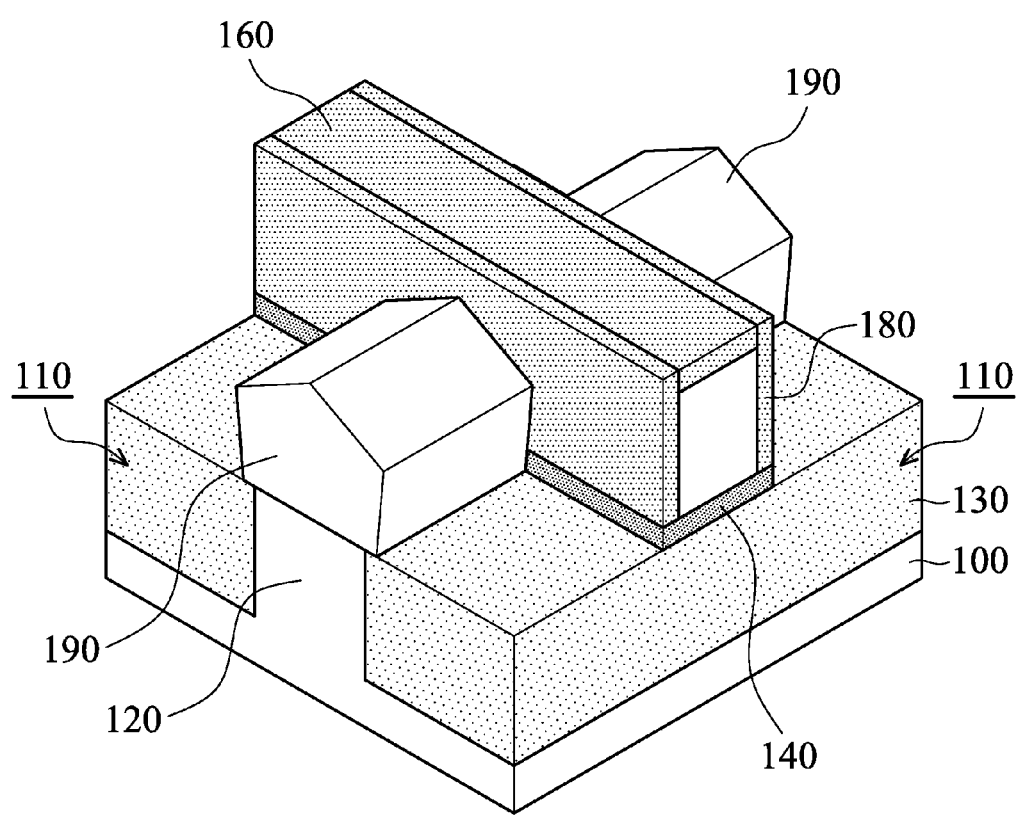

As shown in FIG. 1D, source or drain structures 190 are formed over the fin structures 120, in accordance with some embodiments. In some embodiments, the source or drain structures 190 adjoin the dielectric layer 140 and the spacer elements 180. The source or drain structures 190 may be used to provide stress or strain to channel regions below the gate electrode 150. As a result, the carrier mobility of the device and device performance are improved.

In some embodiments, some portions of the fin structures 120 that are not covered by the dielectric layer 140 are recessed to be lower than the dielectric layer 140. In some other embodiments, some portions of the fin structures 120 are recessed to be lower than the top surface of the isolation features 130. In some embodiments, one or more etching operations are performed to remove the upper portions of the fin structures 120. It should be noted that embodiments of the disclosure have many variations. In some other embodiments, the fin structures 120 are not partially removed.

In some embodiments, a semiconductor material (or two or more semiconductor materials) is epitaxially grown over the fin structures 120 that are recessed, and is growing continually to form the source or drain structures 190. In some embodiments, the growth of the source or drain structures 190 is performed simultaneously. In some embodiments, the growth of some of the source or drain structures 190 is performed separately in different processes.

In some embodiments, the source or drain structures 190 are a P-type semiconductor material. For example, the source or drain structures 190 may include epitaxially grown silicon or epitaxially grown silicon germanium. The source or drain structures 190 are not limited to being a P-type semiconductor material. In some embodiments, the source or drain structures 190 are an N-type semiconductor material. The source or drain structures 190 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the source or drain structures 190 are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the source or drain structures 190 may use gaseous and/or liquid precursors. In some embodiments, the source or drain structures 190 are grown in-situ in the same process chamber. In other words, the source or drain structures 190 are formed using an in-situ epitaxial growth process. In some other embodiments, some of the source or drain structures 190 are grown separately.

In some embodiments, the source or drain structures 190 are doped with one or more suitable dopants. For example, the source or drain structures 190 are Si source or drain features doped with phosphorus (P), arsenic (As), or another suitable dopant. Alternatively, the source or drain structures 190 are SiGe source or drain features doped with boron (B) or another suitable dopant. In some embodiments, multiple implantation processes are performed to dope the source or drain structures 190. In some embodiments, the spacer elements 180, which are formed over the sidewalls of the gate electrode 150 and the hard mask 160, assists in the formation of the source or drain structures 190.

In some embodiments, the source or drain structures 190 are doped in-situ during the growth of the source or drain structures 190. In some other embodiments, the source or drain structures 190 are not doped during the growth of the source or drain structures 190. After the epitaxial growth, the source or drain structures 190 are doped in a subsequent process. In some embodiments, the doping is achieved using an ion implantation process, a plasma immersion ion implantation process, a gas and/or solid source diffusion process, another applicable process, or a combination thereof. In some embodiments, the source or drain structures 190 are further exposed to annealing processes to activate the dopants. For example, a rapid thermal annealing process is performed.

Figure 1E:
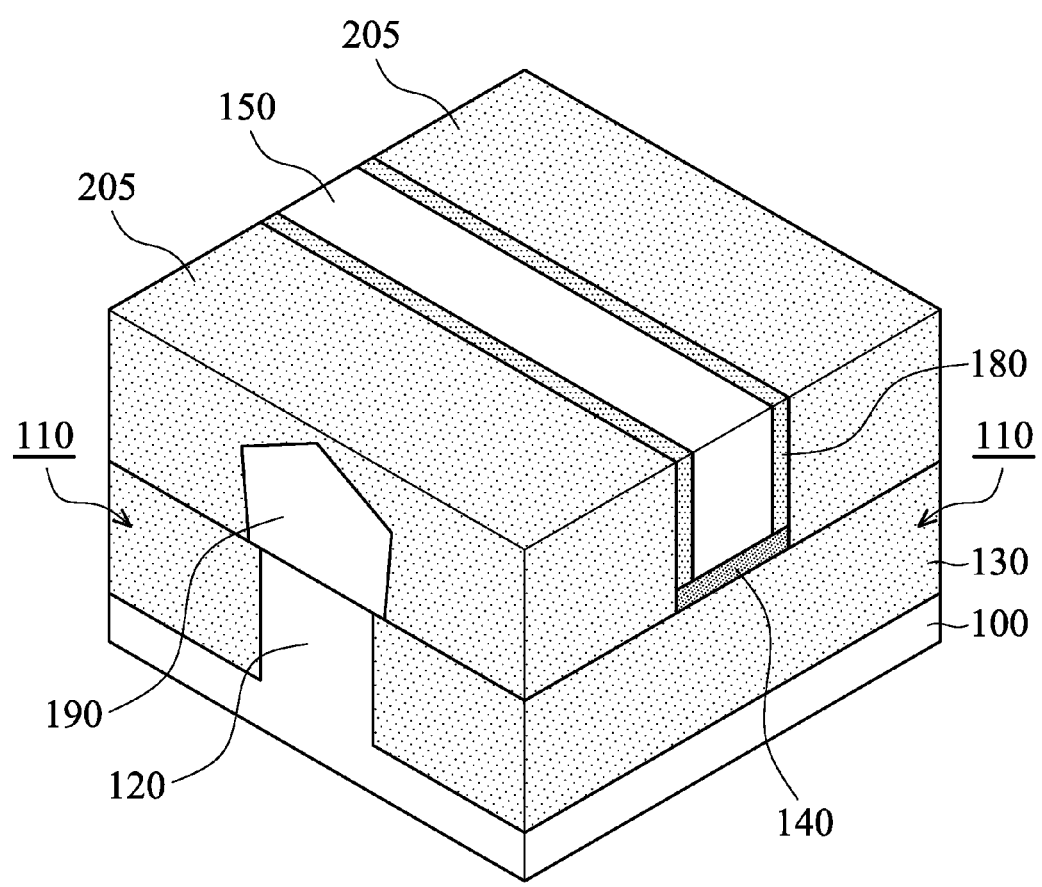

As shown in FIG. 1E, a dielectric layer 205 is deposited over the isolation features 130, the source or drain structures 190 and the gate electrode 150. In some embodiments, the source or drain structures 190 are surrounded by the dielectric layer 205. In some embodiments, the dielectric layer 205 includes silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. In some embodiments, the dielectric layer 205 is deposited using a CVD process, a spin-on process, an ALD process, a PVD process, another applicable process, or a combination thereof.

Afterwards, the dielectric layer 205 is thinned down until the gate electrode 150 is exposed. In some embodiments, a planarization process is performed to thin down the dielectric layer 205. The planarization process may include a CMP process, a grinding process, an etching process, another applicable process, or a combination thereof. In some embodiments, the dielectric layer 205 is deposited over the hard mask 160 and the spacer elements 180. The hard mask 160 and the upper portions of the spacer elements 180 are removed during the planarization process for thinning down the dielectric layer 205 or by an etching process. In some embodiments, the etching process includes a dry etching process, a wet etching process or another suitable etching process.

Figure 1F:
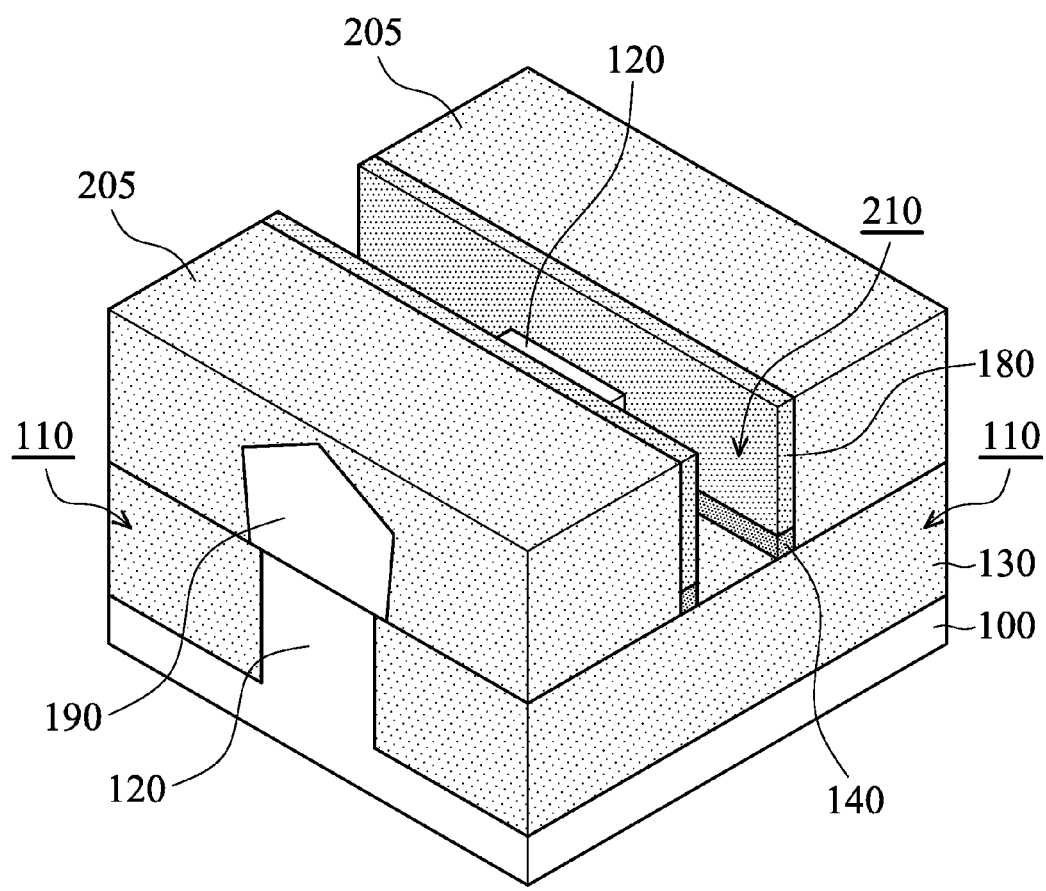
Figure 2A:
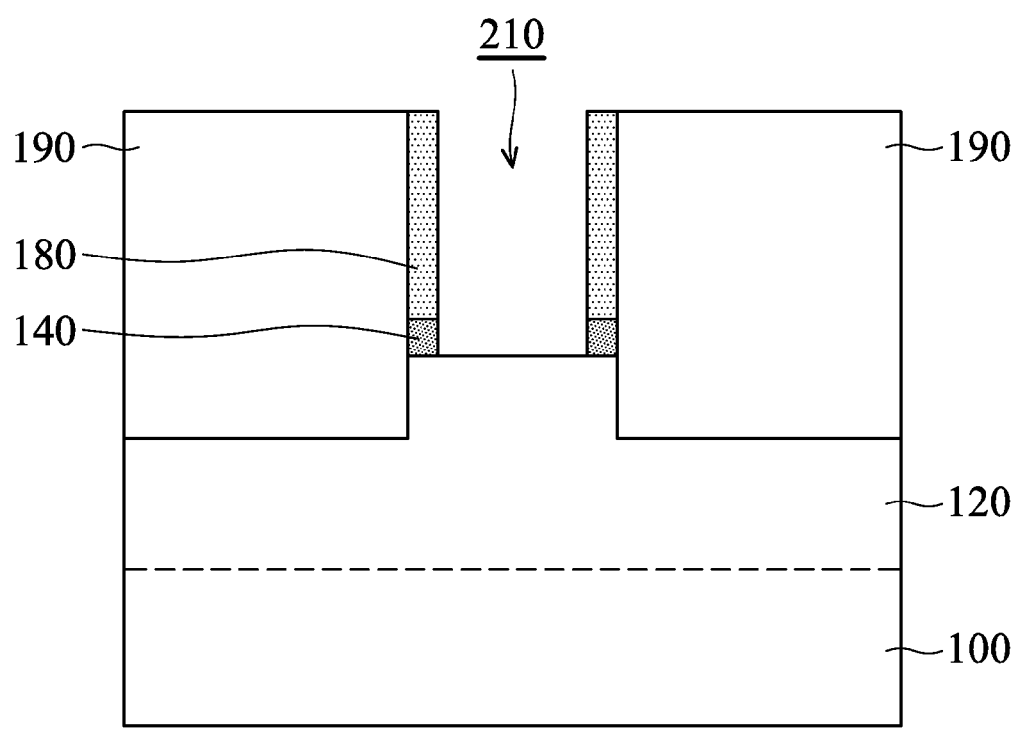
FIGS. 2A-2F are cross-sectional views of various stages of a process for forming a semiconductor device structure, in accordance with some embodiments.

A sacrificial gate stack including the gate electrode 150 and the dielectric layer 140 below the gate electrode 150 is removed, as shown in FIGS. 1F and 2A in accordance with some embodiments. As a result, a trench 210 is formed over the semiconductor substrate 100. In some embodiments, the trench 210 exposes portions of the fin structures 120 and the isolation features 130 that were previously covered by the gate electrode 150 and the dielectric layer 140. The exposed portions of the fin structures 120 may serve as channel regions. In some embodiments, the sacrificial gate stack is removed using a wet etching process, a dry etching process, another applicable process, or a combination thereof. In some other embodiments, the spacer elements 180 are not formed, and the dielectric layer 140 over the semiconductor substrate 100 is removed.

Figure 1G:
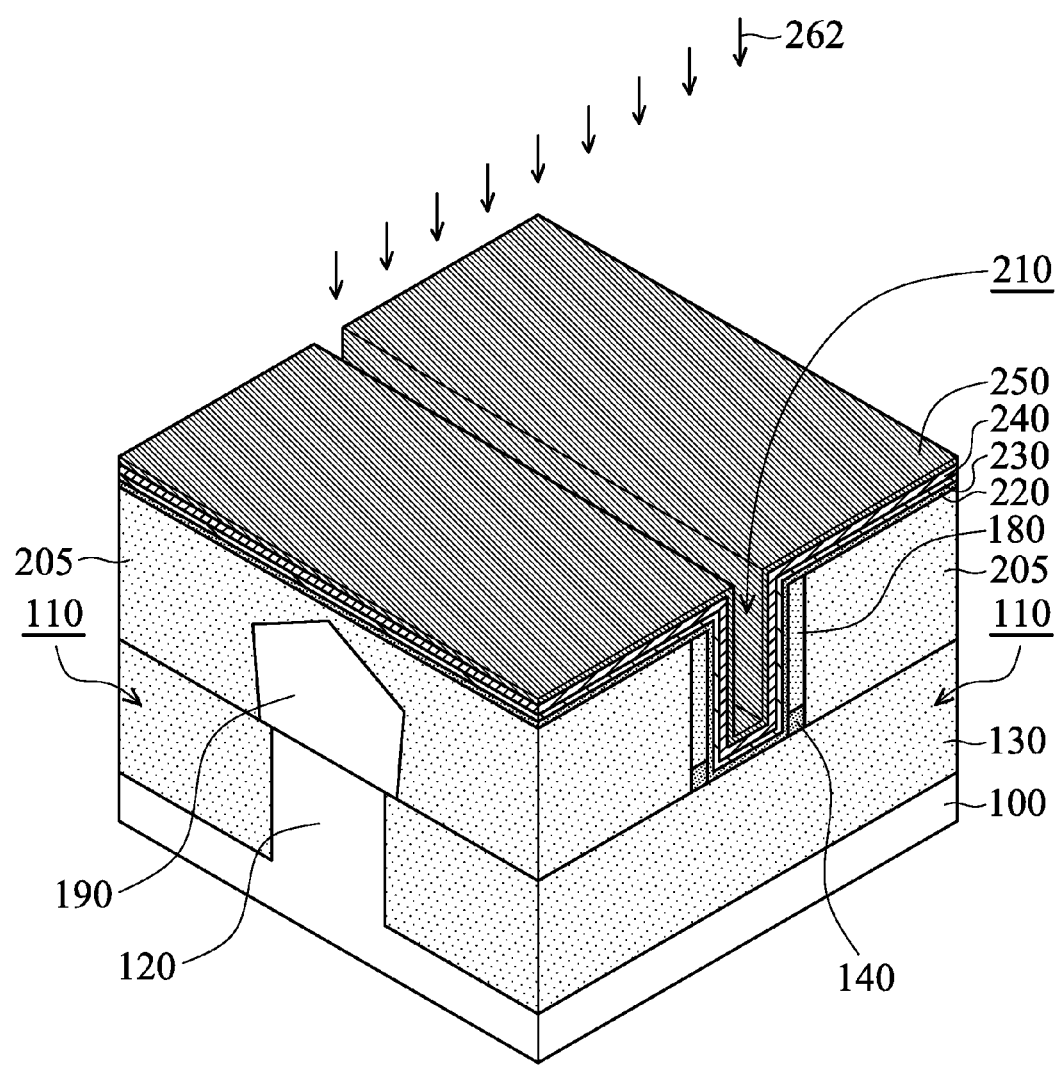
Figure 2B:
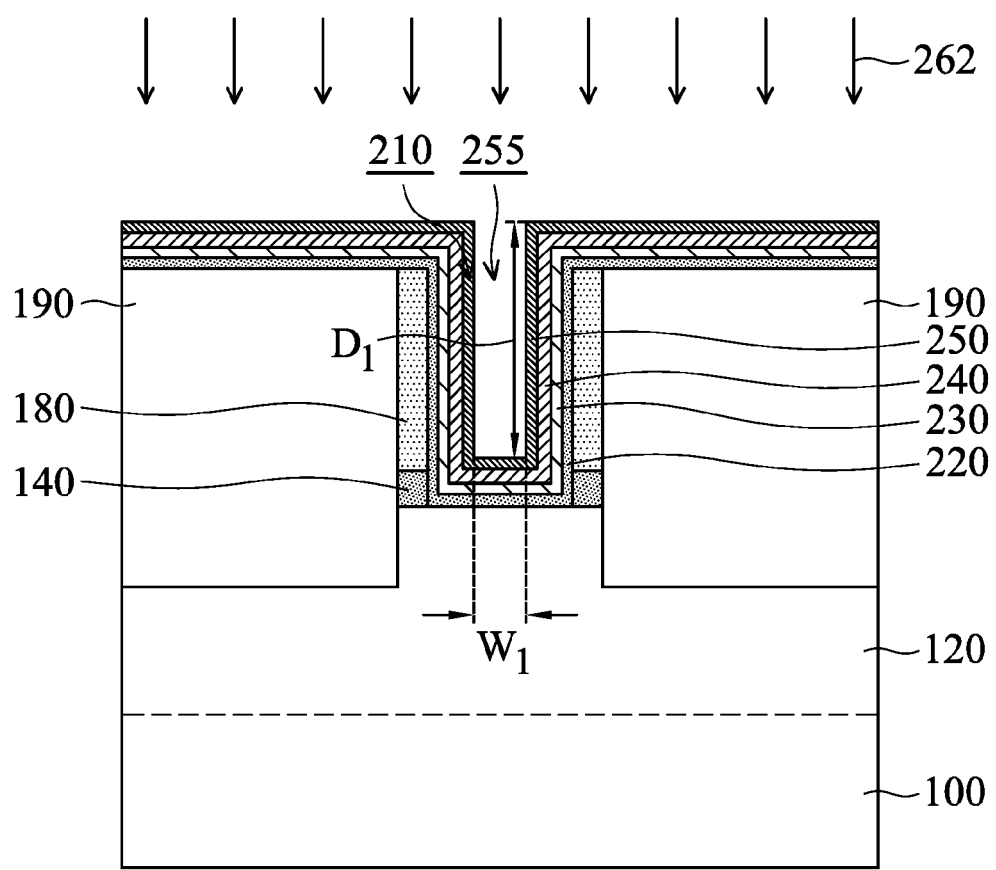

As shown in FIGS. 1G and 2B, a gate dielectric layer 220 is deposited over the sidewalls and the bottom of the trench 210, in accordance with some embodiments. In some embodiments, the gate dielectric layer 220 extends over the fin structures 120 and the dielectric layer 205 conformally. In some embodiments, the gate dielectric layer 220 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 220 is deposited using an ALD process, a CVD process, a spin-on process, another applicable process, or a combination thereof. In some embodiments, a high-temperature annealing operation is performed to reduce or eliminate defects in the gate dielectric layer 220.

Many variations and/or modifications can be made to embodiments of the disclosure. In some other embodiments, before the gate dielectric layer 220 is formed, an interfacial layer (not shown) is formed in the trench 210. The interfacial layer may be used to reduce stress between the gate dielectric layer 220 and the fin structures 120. In some embodiments, the interfacial layer includes silicon oxide or another suitable material. In some embodiments, the interfacial layer is formed using an ALD process, a thermal oxidation process, another applicable process, or a combination thereof.

Afterwards, a metal gate stack structure is formed in the trench 210, in accordance with some embodiments. In some embodiments, metal gate stacking layers are deposited over the gate dielectric layer 220 to form the metal gate stack structure. In some embodiments, the metal gate stacking layers include a capping layer 230, a work function layer 240, a glue layer 250, a seed layer (or a nucleation layer) 260 and a metal filling layer 270. Some of these metal gate stacking layers can be replaced or eliminated for different embodiments. Additional layers can be added to form the metal gate stacking layers.

As shown in FIGS. 1G and 2B, the capping layer 230 is deposited over the gate dielectric layer 220, in accordance with some embodiments. The capping layer 230 may be used to interface the gate dielectric layer 220 with the subsequently formed work function layer 240. The capping layer 230 may be referred to as a barrier layer that is used to prevent diffusion between the gate dielectric layer 220 and the work function layer 240. In some embodiments, the capping layer 230 protects the gate dielectric layer 220 during the annealing operation that is used to reduce or eliminate defects in the gate dielectric layer 220.

In some embodiments, the capping layer 230 extends over the sidewalls and the bottom of the trench 210 conformally. In some embodiments, the capping layer 230 is made of a metal-containing material. The metallic material may include titanium nitride, tantalum nitride, another suitable material, or a combination thereof. In some embodiments, the capping layer 230 includes multiple layers. In some embodiments, the capping layer 230 is deposited using an ALD process, a PVD process, an electroplating process, an electroless plating process, a CVD process, another applicable process, or a combination thereof.

As shown in FIGS. 1G and 2B, the work function layer 240 is deposited over the capping layer 230, in accordance with some embodiments. The work function layer 240 is used to provide the desired work function for transistors to enhance device performance including improved threshold voltage (Vt). In some embodiments, the work function layer 240 extends over the sidewalls and the bottom of the trench 210 conformally.

In the embodiments of forming an NMOS transistor, the work function layer 240 can be an N-type metal layer. The N-type metal layer is capable of providing a work function value suitable for the device. The work function value may be substantially equal to or less than about 4.5 eV. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a PMOS transistor, the work function layer 240 can be a P-type metal layer. The P-type metal layer is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer 240 may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combination thereof. The thickness and/or the compositions of the work function layer 240 may be fine-tuned to adjust the work function level. For example, a titanium nitride layer may be used as a P-type metal layer or an N-type metal layer, depending on the thickness and/or the compositions of the titanium nitride layer. In the embodiments, the work function layer 240 has a multi-layer structure.

As shown in FIGS. 1G and 2B, the glue layer 250 is deposited over the work function layer 240, in accordance with some embodiments. The glue layer 250 may be used to increase the adhesion between the work function layer 240 and the subsequently formed metal filling layer 270 (shown in FIGS. 1I and 2E). As a result, the subsequently formed metal filling layer 270 is prevented from peeling or delamination. In some embodiments, the glue layer 250 extends over the sidewalls and the bottom of the trench 210 conformally.

In some embodiments, the glue layer 250 includes tantalum nitride, titanium nitride, another suitable material, or a combination thereof. In some embodiments, the glue layer 250 is deposited using an ALD process, a PVD process, an electroplating process, an electroless plating process, another applicable process, or a combination thereof.

As shown in FIGS. 1G and 2B, the capping layer 230, the work function layer 240 and the glue layer 250 do not completely fill the trench 210, in accordance with some embodiments. As a result, the capping layer 230, the work function layer 240 and the glue layer 250 surround a gap 255 over the fin structures 120.

As shown in FIG. 2B, the gap 255 has a width $W_1$ and a depth $D_1$. In some embodiments, the width $W_1$ is in a range from about 2 nm to about 10 nm. In some embodiments, the depth $D_1$ is in a range from about 100 nm to about 140 nm. In some embodiments, the aspect ratio ($D_1/W_1$) of the gap 255 is in a range from about 10 nm to about 70 nm.

Figure 2C:
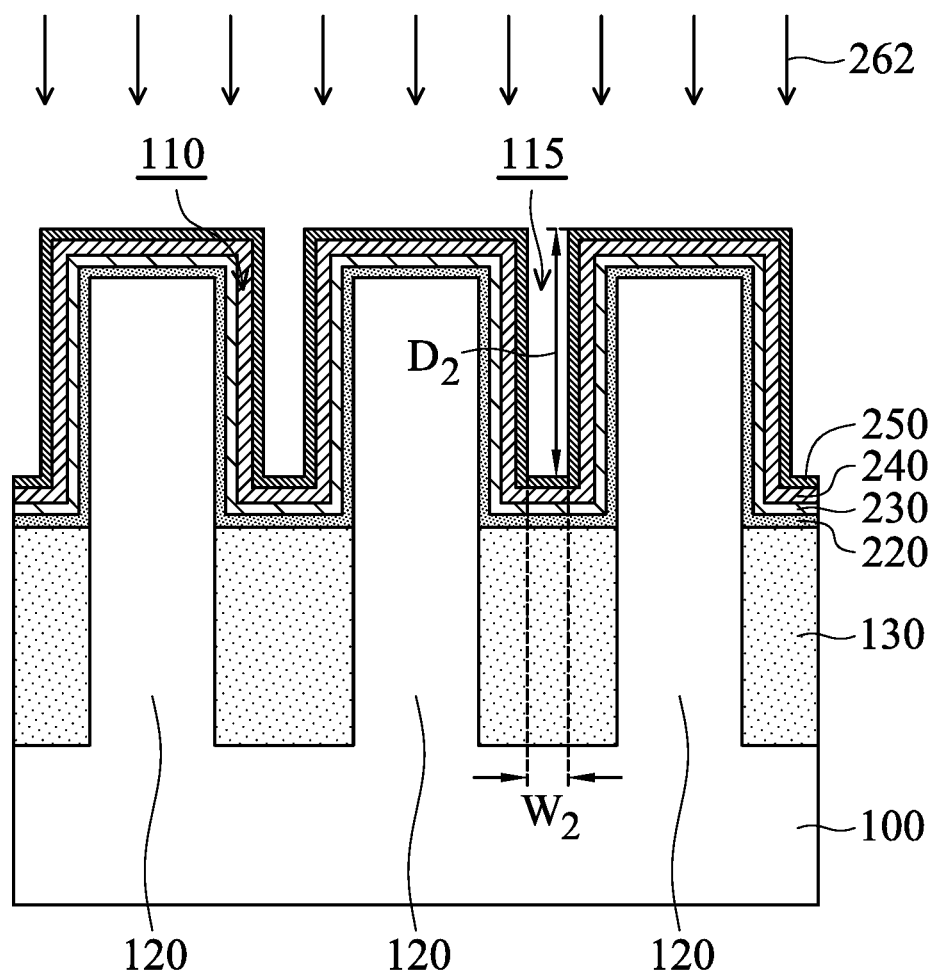

As shown in FIG. 2C, the capping layer 230, the work function layer 240 and the glue layer 250 surround the side surfaces and the top surface of the fin structures 120, in accordance with some embodiments. In some embodiments, the capping layer 230, the work function layer 240 and the glue layer 250 extend in the recesses 110 between the fin structures 120 and over the isolation features 130. In some embodiments, the capping layer 230, the work function layer 240 and the glue layer 250 do not completely fill the recesses 110. As a result, the capping layer 230, the work function layer 240 and the glue layer 250 surround a gap 115 over the isolation features 130.

As shown in FIG. 2C, the gap 115 has a width $W_2$ and a depth $D_2$. In some embodiments, the width $W_2$ is in a range from about 1 nm to about 4 nm. In some embodiments, the depth $D_2$ is in a range from about 30 nm to about 50 nm. In some embodiments, the aspect ratio ($D_2/W_2$) of the gap 115 is in a range from about 10 nm to about 50 nm.

Figure 1H:
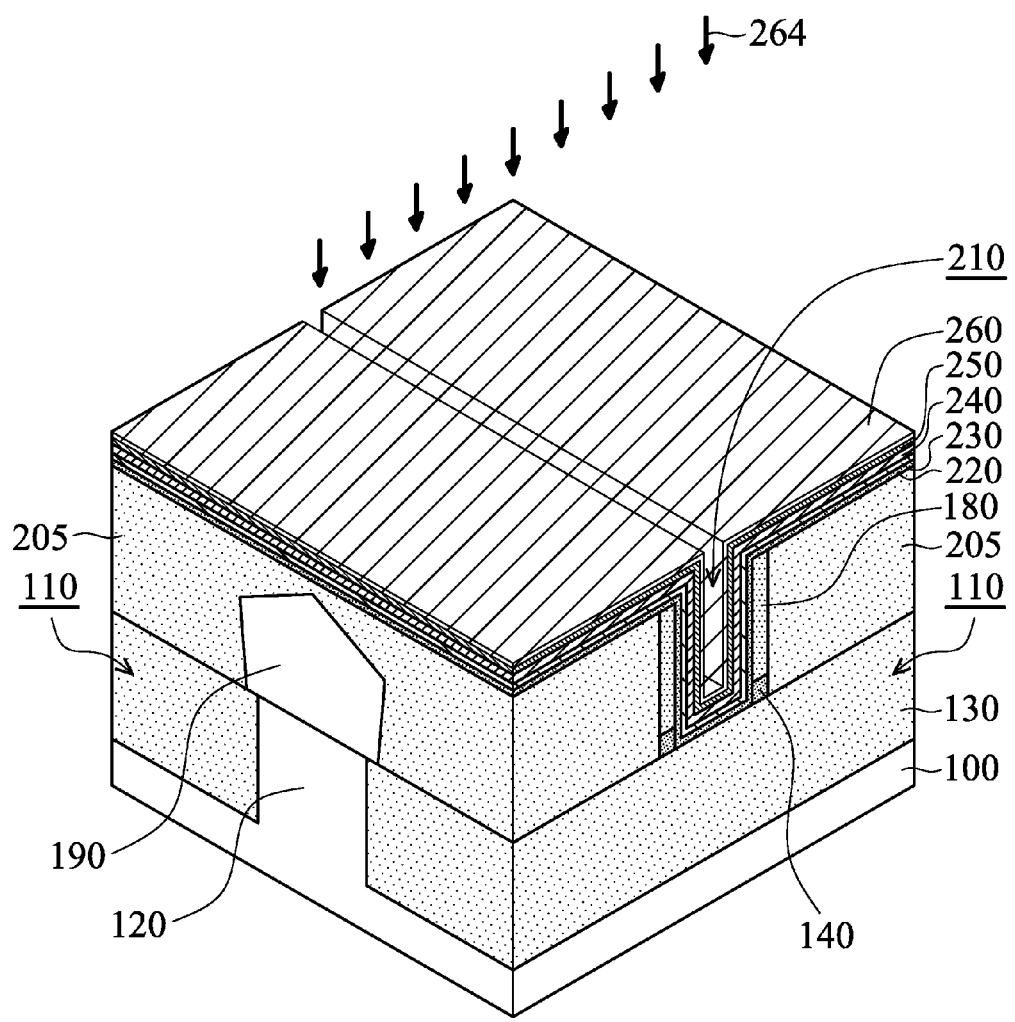
Figure 1I:
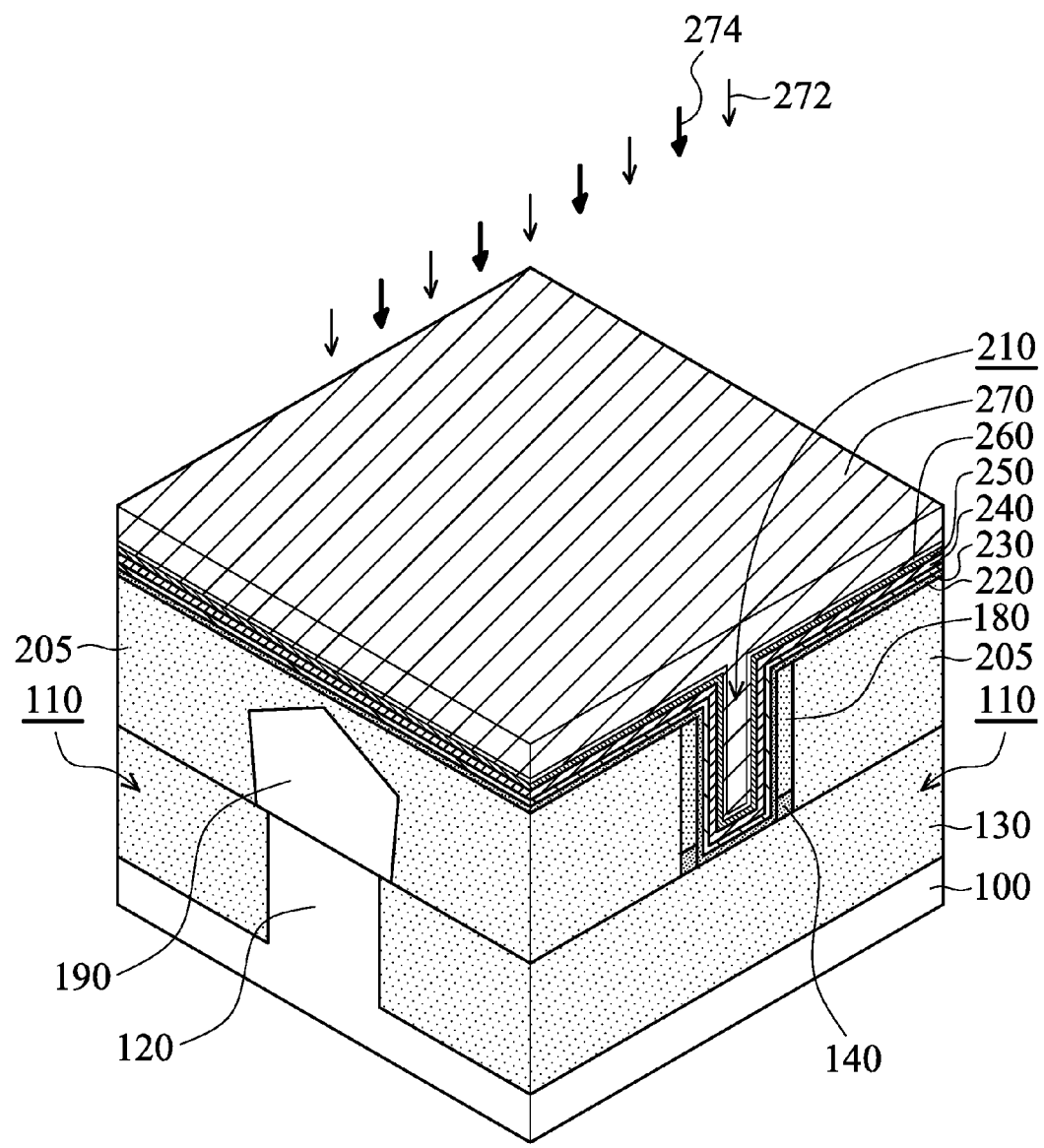
Figure 2D:
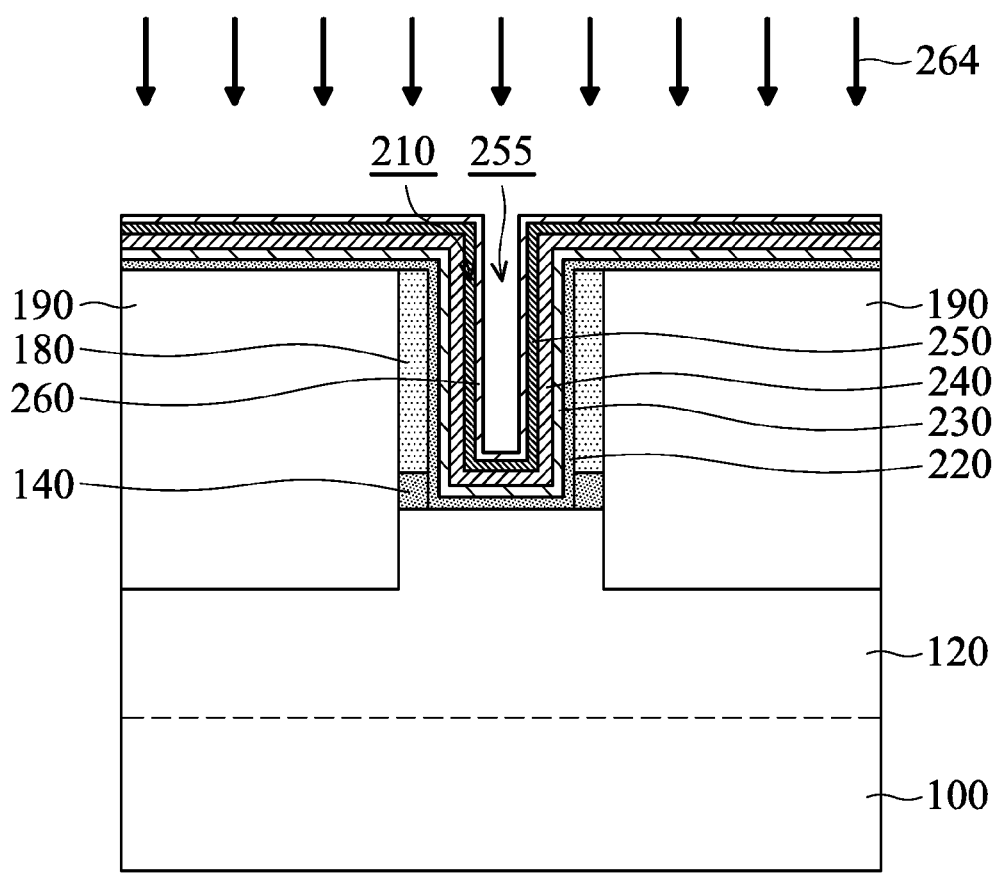

As shown in FIGS. 1H and 2D, the seed layer 260 is deposited over the glue layer 250, in accordance with some embodiments. The seed layer 260 is used to assist in the subsequent deposition of the metal filling layer 270 (shown in FIGS. 1I and 2E). In some embodiments, the seed layer 260 fills the gap 255 in the trench 210. In some embodiments, the seed layer 260 extends over the sidewalls and the bottom of the trench 210 conformally. In some embodiments, the seed layer 260 fills the gap 115 in one of the recesses 110.

In some embodiments, the seed layer 260 includes tungsten, another suitable material, or a combination thereof. In some embodiments, the seed layer 260 includes a crystalline material containing grains. The seed layer 260 may include a polycrystalline material. In some other embodiments, the seed layer 260 includes an amorphous-like or amorphous material. The seed layer 260 may include few grains or substantially no grain in the seed layer 260.

In some embodiments, the seed layer 260 includes a material that is substantially free of fluoride or fluorine. Accordingly, there is substantially no fluorine diffused from the seed layer 260 into other features during and after the deposition of the seed layer 260. The other features may include any features in the semiconductor device structure, such as the work function layer 240.

In some embodiments, the seed layer 260 has a thickness in a range from about 20 Å to about 50 Å. Although FIGS. 1H and 2D show that the seed layer 260 is a single layer, embodiments of the disclosure are not limited thereto. In some other embodiments, the seed layer 260 has a multi-layer structure.

In some embodiments, the seed layer 260 is deposited using an ALD process, another applicable process, or a combination thereof. In some embodiments, no annealing process is performed after the deposition of the seed layer 260 and before the subsequent deposition of the metal filling layer 270.

In accordance with some embodiments, the structure shown in FIGS. 1G and 2B is transferred into in a deposition chamber to deposit the seed layer 260 using an ALD process. In some embodiments, the ALD process for depositing the seed layer 260 is a non-plasma deposition process. Accordingly, the structure shown in FIGS. 1G and 2B is prevented from plasma-induced damage.

In some embodiments, the ALD process for depositing the seed layer 260 includes a unit cycle. The unit cycle includes sequentially introducing a gaseous precursor 262 into the deposition chamber, purging the deposition chamber, introducing a reactant 264 into the deposition chamber to perform a reduction reaction, and purging the deposition chamber after the reduction reaction. In some embodiments, the unit cycle is repeated one or more times to grow the seed layer 260 having a predetermined thickness over the glue layer 250.

Specifically, the glue layer 250 is exposed to the gaseous precursor 262, in accordance with some embodiments as shown in FIGS. 1G, 2B and 2C. The precursor compound is absorbed to the top surface of the glue layer 250. Afterwards, the deposition chamber is purged with an inert gas, such as Ar, to remove the unabsorbed precursor compound. Subsequently, the reactant 264 (shown in FIGS. 1H and 2D) is introduced into the deposition chamber and reacts with the precursor compound. The precursor compound is reduced. As a result, a precursor monolayer is formed on the top surface of the glue layer 250. The deposition chamber is then purged with an inert gas, such as Ar, to remove unreacted reactant 264. One or more precursor monolayers are sequentially deposited and together form the seed layer 260.

In some embodiments, the deposition of the seed layer 260 is performed at a temperature that is in a range from about 400 degrees C. to about 500 degrees C. In some embodiments, the deposition of the seed layer 260 is performed at a pressure that is in a range from about 10 torr to about 50 torr.

In some embodiments, the precursor source used to deposit the seed layer 260 includes a tungsten-containing material. In some embodiments, the tungsten-containing material is substantially devoid of fluoride or fluorine. In some embodiments, the tungsten-containing material includes a tungsten compound with halogen, another suitable material, or a combination thereof. The tungsten compound with halogen may be tungsten chloride (i.e., $WCl_x$), such as $WCl_5$ or $WCl_6$. Other suitable materials of the tungsten-containing material may include tungsten carbonyl (i.e., $W(CO)_x$), such as $W(CO)_5$ or $W(CO)_6$, or $W_wC_xH_yN_z$ (where the concentration of tungsten ranges from about 20 at % to about 70 at %, the concentration of carbon ranges from about 0 at % to about 50 at %, the concentration of hydrogen ranges from about 0 at % to about 50 at %, and the concentration of nitrogen ranges from about 20 at % to about 70 at %).

In some embodiments, the precursor source used to deposit the seed layer 260 is heated to a temperature that is in a range from about 100 degrees C. to about 150 degrees C. As a result, the gaseous precursor 262 is produced. In some embodiments, the gaseous precursor 262 substantially excludes plasma. In some embodiments, the gaseous precursor 262 is introduced into the deposition chamber by a carrier gas. In some embodiments, the carrier gas includes an inert gas. The inert gas includes argon (Ar), helium (He), nitrogen ($N_2$), another suitable gas, or a combination thereof.

In some embodiments, the reactant 264 is a reduction agent or a reduction gas. The reactant 264 includes a hydrogen-containing material, such as hydrogen ($H_2$), $NH_3$ or $B_2H_6$, another suitable reactant, or a combination thereof. In some embodiments, the reactant 264 substantially excludes plasma.

In some embodiments, the glue layer 250 includes oxidized portions on its top surface. The oxidized portions of the glue layer 250 are removed before the deposition of the seed layer 260. In some embodiments, the oxidized portions of the glue layer 250 are exposed to the gaseous precursor 262. As a result, oxygen in the oxidized portions of the glue layer 250 reacts with the gaseous precursor 262 and is removed from the glue layer 250.

In some embodiments, by-products are produced after the deposition of the seed layer 260. The by-products may include a hydrogen-containing material (such as HCl or $H_2O$), another compound, or a combination thereof. In some embodiments, the by-products encompass any chemical species excluding tungsten, which are produced by the reduction reaction. Afterwards, in some embodiments, the by-products are removed by an inert gas, such as Ar.

Figure 2E:
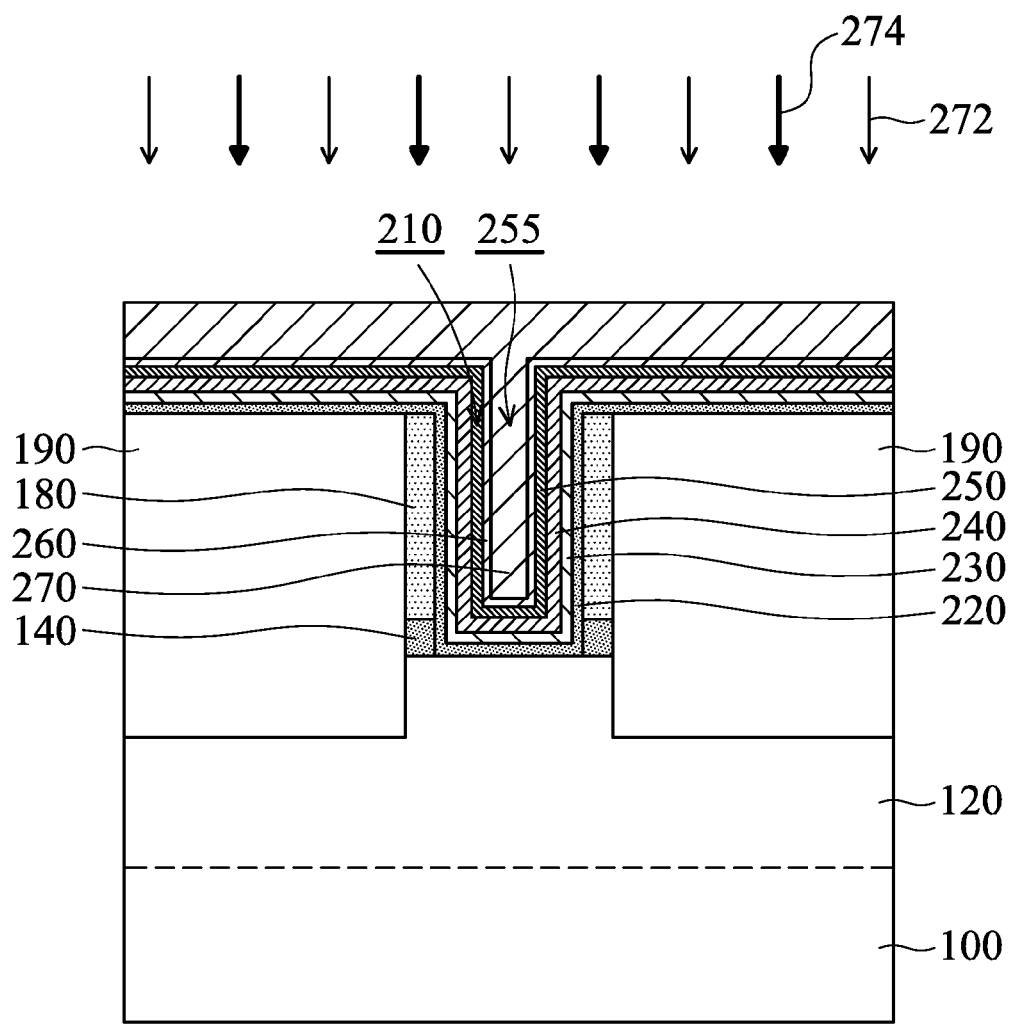

As shown in FIGS. 1I and 2E, the metal filling layer 270 is deposited over the seed layer 260 to fill up the trench 210, in accordance with some embodiments. In some embodiments, the metal filling layer 270 is deposited in the trench 210 non-conformally. In some embodiments, the metal filling layer 270 is a bulk layer. In some embodiments, the seed layer 260 and the metal filling layer 270 together form a tungsten bulk layer.

In some embodiments, the metal filling layer 270 fills up the gaps 115 and 255 that are surrounded by the capping layer 230, the work function layer 240 and the glue layer 250. As a result, the metal filling layer 270 is surrounded by the gate dielectric layer 220, the capping layer 230, the work function layer 240 and the glue layer 250.

In some embodiments, the metal filling layer 270 includes tungsten, another suitable material, or a combination thereof. In some embodiments, the metal filling layer 270 includes tungsten to provide the gate stack with low gate resistance. In some embodiments, the metal filling layer 270 includes a crystalline material containing grains. The metal filling layer 270 may include a polycrystalline material. In some embodiments, the size of grains in the metal filling layer 270 is greater than that of grains in the seed layer 260.

In some embodiments, the metal filling layer 270 includes a material that is substantially free of fluoride or fluorine. Accordingly, there is substantially no fluorine diffused from the metal filling layer 270 into other features during and after the deposition of the metal filling layer 270. The other features may include any features in the semiconductor device structure, such as the work function layer 240.

In some embodiments, the metal filling layer 270 has a thickness in a range from about 1000 Å to about 3000 Å. Although FIGS. 1I and 2E show that the metal filling layer 270 is a single layer, embodiments of the disclosure are not limited thereto. In some other embodiments, the metal filling layer 270 has a multi-layer structure.

In some embodiments, the metal filling layer 270 is deposited using a CVD process, another applicable process, or a combination thereof. In some embodiments, no annealing process is performed after the deposition of the metal filling layer 270 and before the partial removal of the metal filling layer 270, which will be described in more detail later. In some embodiments, an annealing process is performed after the partial removal of the metal filling layer 270.

In accordance with some embodiments, a CVD process is performed over the structure shown in FIGS. 1H and 2D to deposit the metal filling layer 270. In some embodiments, the CVD process for depositing the metal filling layer 270 is a non-plasma deposition process. Accordingly, the structure shown in FIGS. 1H and 2D is prevented from plasma-induced damage. In some embodiments, the growth rate of the metal filling layer 270 by using a CVD process is greater than that of the seed layer 260 by using an ALD process.

In some embodiments, the CVD process for depositing the metal filling layer 270 includes introducing a gaseous precursor 272 and a reactant 274 into the deposition chamber, as shown in FIGS. 1I and 2E. In some embodiments, the gaseous precursor 272 reacts with the reactant 274 and then is reduced. As a result, the metal filling layer 270 having a predetermined thickness is grown over the seed layer 260. Subsequently, the deposition chamber is purged with an inert gas, such as Ar, to remove unreacted gaseous precursor 272 and/or unreacted reactant 274.

In some embodiments, the deposition of the metal filling layer 270 is performed at a temperature that is in a range from about 400 degrees C. to about 500 degrees C. In some embodiments, the deposition of the metal filling layer 270 is performed at a pressure that is in a range from about 50 torr to about 300 torr.

In some embodiments, the precursor source used to deposit the metal filling layer 270 includes a tungsten-containing material. In some embodiments, the tungsten-containing material is substantially devoid of fluoride or fluorine. In some embodiments, the tungsten-containing material includes a tungsten compound with halogen, another suitable material, or a combination thereof. The tungsten compound with halogen may be tungsten chloride, such as $WCl_5$ or $WCl_6$. Other suitable materials of the tungsten-containing material may include tungsten carbonyl, such as $W(CO)_5$ or $W(CO)_6$, or $W_wC_xH_yN_z$.

In some embodiments, the precursor for depositing the metal filling layer 270 is substantially the same as that for depositing the seed layer 260. In some embodiments, the growth rate of the metal filling layer 270 deposited by using $WCl_5$ is greater than that of the metal filling layer 270 deposited by using $WCl_6$. In some embodiments, the operation power for the deposition of the metal filling layer 270 by using $WCl_x$ is lower than that for the deposition of the metal filling layer 270 by using $W(CO)_x$.

In some embodiments, the precursor source used to deposit the metal filling layer 270 is heated to a temperature that is in a range from about 100 degrees C. to about 150 degrees C. As a result, the gaseous precursor 272 is generated. In some embodiments, the gaseous precursor 272 substantially excludes plasma. In some embodiments, the gaseous precursor 272 is introduced into the deposition chamber by a carrier gas. In some embodiments, the carrier gas includes Ar, He, $N_2$, another suitable gas, or a combination thereof.

In some embodiments, the reactant 274 is a reduction agent or a reduction gas. The reactant 274 includes a hydrogen-containing material, such as $H_2$ or $NH_3$, another suitable reactant, or a combination thereof. In some embodiments, the reactant 274 substantially excludes plasma.

In some embodiments, a gas including the reactant 274 and the gaseous precursor 272 is introduced to the top surface of the seed layer 260. The gas is substantially free of fluorine. The gas may be substantially free of fluorine and carbon. In some embodiments, there is substantially no plasma applied to the top surface of the seed layer 260 during the deposition of the metal filling layer 270. In some embodiments, there is substantially no fluorine-containing plasma applied to the top surface of the seed layer 260.

In some embodiments, by-products are produced after the deposition of the metal filling layer 270. The by-products may include a hydrogen-containing material (such as HCl or $H_2O$), another compound, or a combination thereof. In some embodiments, the by-products encompass any chemical species excluding tungsten, which are produced by the reduction reaction. Afterwards, in some embodiments, the by-products are removed by an inert gas, such as Ar.

Figure 1J:
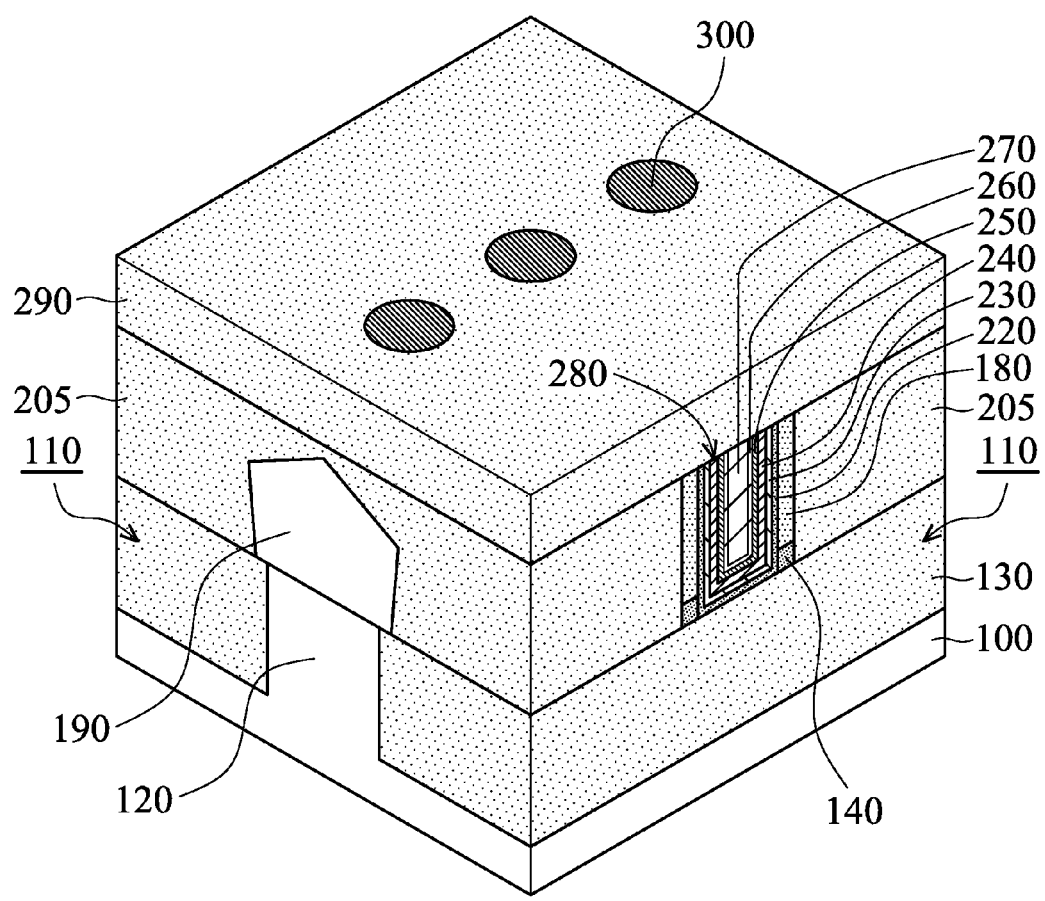
Figure 2F:
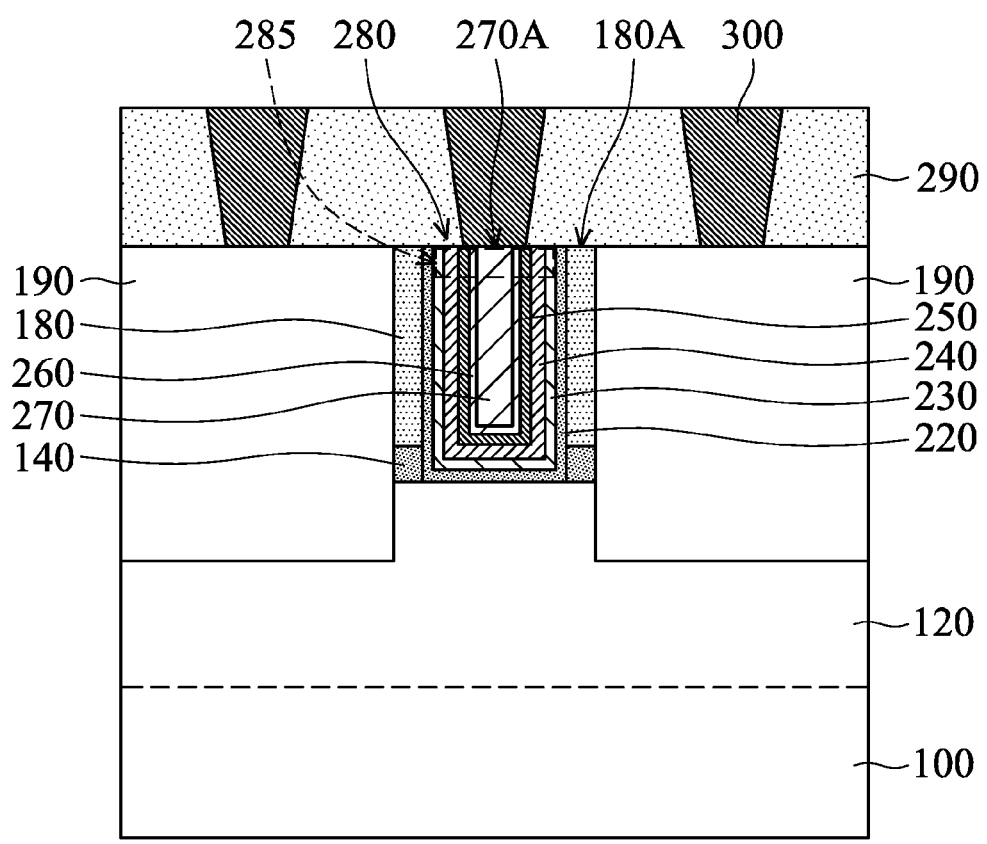

As shown in FIGS. 1I and 2E, the gate dielectric layer 220 and the metal gate stacking layers together fill the trench 210, in accordance with some embodiments. In some embodiments, the portions of the gate dielectric layer 220 and the metal gate stacking layers outside of the trench 210 cover the dielectric layer 205. Afterwards, the portions of the gate dielectric layer 220 and the metal gate stacking layers outside of the trench 210 are removed. As a result, the metal gate stacking layers remaining in the trench 210 together form a metal gate stack structure 280, as shown in FIGS. 1J and 2F. The metal gate stack structure 280 and the gate dielectric layer 220 remaining in the trench 210 together form a gate stack.

In some embodiments, a planarization process is used to partially remove the gate dielectric layer 220 and the metal gate stacking layers outside of the trench 210 until the top surface 180A of the spacer elements 180 is exposed. In some embodiments, the planarized metal filling layer 270 has a top surface 270A that is substantially coplanar with the top surface 180A. The planarization process may include a CMP process, a grinding process, an etching process, another applicable process, or a combination thereof.

In some embodiments, the metal filling layer 270 has a substantial fluorine-free portion. The substantial fluorine-free portion is partially removed during the planarization process.

As shown in FIG. 2F, the metal gate stack structure 280 has a top portion 285. In some embodiments, the top portion 285 (or the top surface of the metal gate stack structure 280) includes tungsten, chlorine and other materials. The other materials may include oxygen, nitrogen, another material, and a combination thereof.

In some embodiments, the top portion 285 is a substantial fluorine-free portion. In some embodiments, the seed layer 260 of the top portion 285 has a concentration of fluorine that is substantially equal to 0 at %. In some embodiments, the metal filling layer 270 of the top portion 285 has a concentration of fluorine that is substantially equal to 0 at %.

In some embodiments, the seed layer 260 of the top portion 285 has a concentration of chlorine in a range from about 0.5 at % to about 5 at %. In some embodiments, the metal filling layer 270 of the top portion 285 has a concentration of chlorine in a range from about 0.5 at % to about 5 at %. In some embodiments, the concentration of chlorine in the seed layer 260 is greater than that in the metal filling layer 270.

In some embodiments, the seed layer 260 has a concentration of carbon that is substantially equal to zero. In some embodiments, the metal filling layer 270 has a concentration of carbon that is substantially equal to zero.

In some embodiments, the atomic concentration is measured by spectroscopy. The spectroscopy may be X-ray photoelectron spectroscopy (XPS) or another suitable type of spectroscopy. In some embodiments, the atomic concentration of the top portion 285 is measured at a depth in a range from about 20 Å to about 30 Å.

As shown in FIGS. 1J and 2F, a dielectric layer 290 is deposited over the dielectric layer 205 and the metal gate stack structure 280, in accordance with some embodiments. In some embodiments, the dielectric layer 290 includes silicon oxide, silicon oxynitride, BSG, PSG, BPSG, FSG, low-K material, porous dielectric material, another suitable dielectric material, or a combination thereof. In some embodiments, the dielectric layer 290 is deposited using a CVD process, a spin-on process, an ALD process, a PVD process, another applicable process, or a combination thereof.

As shown in FIGS. 1J and 2F, conductive contacts 300 are formed to electrically connect to the metal gate stack structure 280 and the source or drain structures 190, in accordance with some embodiments. In some embodiments, the dielectric layer 290 is patterned to form contact openings that expose the metal gate stack structure 280 and the source or drain structures 190. Afterwards, a conductive material layer is deposited over the dielectric layer 290 to fill the contact openings. A planarization process is subsequently used to remove the portions of the conductive material layer outside of the contact openings. As a result, the remaining portions of the conductive material layer in the contact openings form the conductive contacts 300.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

In accordance with some embodiments, as mentioned above, the seed layer 260 and the metal filling layer 270 include a material that is substantially free of fluoride or fluorine. There is substantially no fluorine diffused from the seed layer 260 and the metal filling layer 270 into the work function layer 240 during the deposition of the seed layer 260 and the metal filling layer 270. The increase of threshold voltage of the semiconductor device structure, which may be a result of fluorine diffusion into the work function layer 240 of the metal gate stack structure 280, is prevented. As a result, the shift in the threshold voltage is greatly reduced or eliminated.

Furthermore, one or more thermal processes are performed after the deposition of the seed layer 260 and the metal filling layer 270. Since the seed layer 260 and the metal filling layer 270 is substantially free of fluoride, fluorine driven from the seed layer 260 and the metal filling layer 270 into the work function layer 240 during subsequent thermal processes is substantially prohibited. The threshold voltage is prevented from being varied during subsequent thermal processes. As a result, variation in threshold voltage during fabrication processes is successively reduced or eliminated. Accordingly, it can be ensured that the threshold voltage is fine-tuned or keeps substantially the same during fabrication processes.

In some cases, fluorine diffusion into the work function layer 240 may result in the decreased band edge of the flat-band voltage (Vfb) of the semiconductor device structure. In accordance with some embodiments, due to the substantial fluorine-free metal filling layer 270, the decreased flat-band voltage of the semiconductor device structure is prevented. Accordingly, it can also be ensured that the flat-band voltage is fine-tuned or stays stable during fabrication processes. Therefore, the device performance and reliability of the semiconductor device structure is significantly improved.

In some embodiments, the semiconductor device structure includes multiple metal gate stack structures of substantially the same size. Many variations and/or modifications can be made to embodiments of the disclosure. In some other embodiments, the semiconductor device structure includes multiple metal gate stack structures with different sizes. For example, a semiconductor device structure may include a metal gate stack structure 280 shown in FIG. 2 and a metal gate stack structure 280' shown in FIG. 3. In some embodiments, the channel region below the metal gate stack structure 280 is longer than that below the metal gate stack structure 280'. In some embodiments, the size or volume of the metal filling layer 270 in the metal gate stack structure 280 is greater than that of the metal filling layer 270' in the metal gate stack structure 280'.

In some cases, a fluorine-containing gate-filling layer, which has a large volume, leads to more fluorine diffusion into a work function layer than another fluorine-containing gate-filling layer, which has a small volume. As a result, multiple transistors of a semiconductor device have different variations of threshold voltage and/or flat-band voltage due to different volumes of fluorine-containing gate-filling layers.

Figure 3:
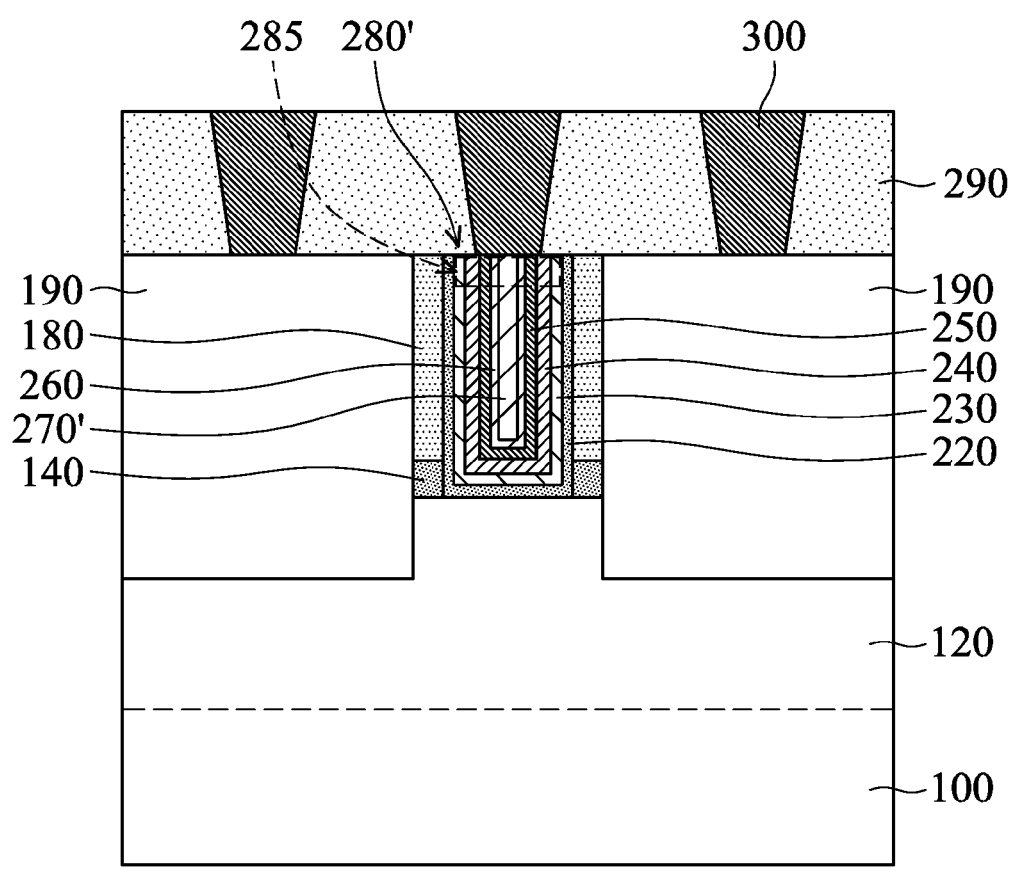
FIG. 3 is a cross-sectional view of one stage of a process for forming a semiconductor device structure, in accordance with some embodiments.

In accordance with some embodiments, the metal gate stack structures 280 and 280' substantially preclude fluoride or fluorine. In particular, the work function layers 240, the seed layers 260, and the metal filling layers 270 and 270' are substantially free of fluoride or fluorine. Even if the metal filling layers 270 and 270' have different volumes, as shown in FIGS. 2 and 3, there is substantially no fluorine diffused or distributed into the work function layers 240. Accordingly, each transistor of the semiconductor device structure has substantially consistent threshold voltage and/or flat-band voltage.

Subsequently, various features will be formed over the dielectric layer 290 and the conductive contacts 300 shown in FIGS. 1J, 2 and 3. Some of the various features are electrically connected to the metal gate stack structure 280 or 280' and the source or drain structures 190 through the conductive contacts 300. The various features may include interconnection layers, vias and other suitable features.

Many variations and/or modifications can be made to embodiments of the disclosure. As mentioned above, in some other embodiments, the seed layer 260 has a multi-layer structure including two or more seed layers. FIGS. 4A-4D are cross-sectional views of various stages of a process for forming a semiconductor device structure, in accordance with some embodiments. The materials and/or formation methods of the semiconductor device structure shown in FIGS. 4A-4D are the same as or similar to those of the semiconductor device structure shown in FIGS. 1A-1J and FIGS. 2A-2F, as illustrated in the aforementioned embodiments, and are not repeated.

Figure 4A:
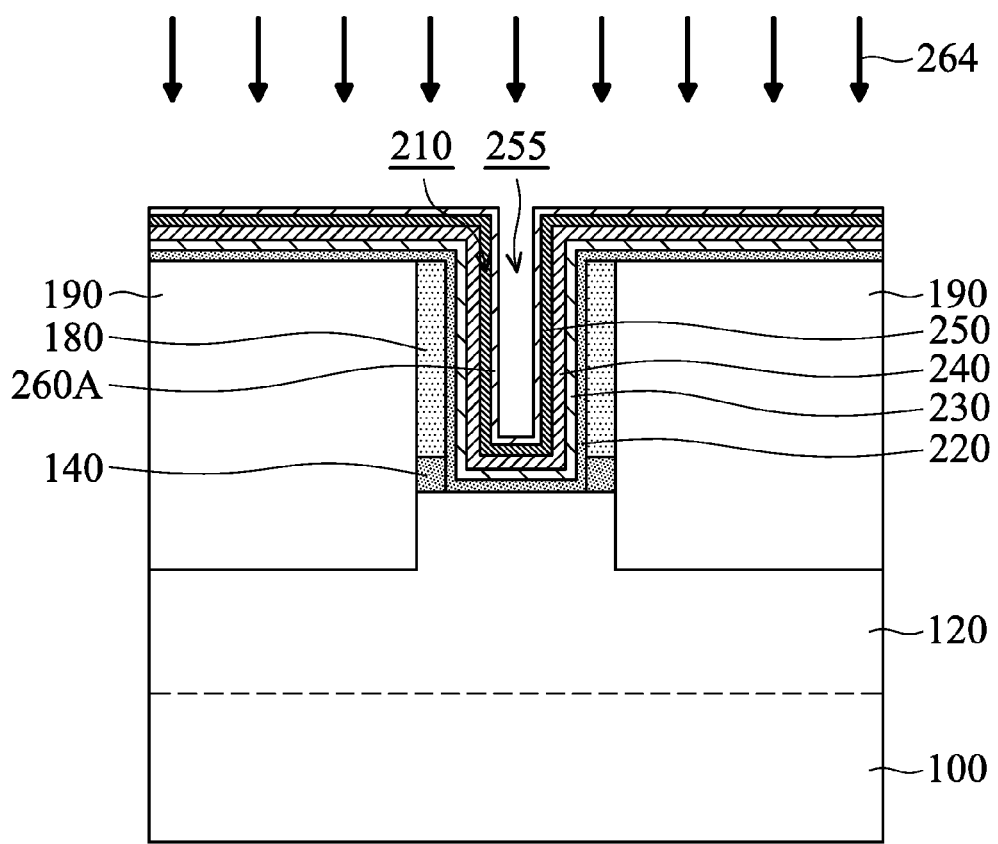
FIGS. 4A-4D are cross-sectional views of various stages of a process for forming a semiconductor device structure, in accordance with some embodiments.

As shown in FIG. 4A, a seed layer 260A is deposited over the glue layer 250 of the semiconductor device structure shown in FIG. 2B, in accordance with some embodiments. In some embodiments, the seed layer 260A fills the gap 255 in the trench 210. In some embodiments, the seed layer 260A extends over the sidewalls and the bottom of the trench 210 conformally. In some embodiments, the seed layer 260A fills the gap 115 in one of the recesses 110.

In some embodiments, the seed layer 260A has a thickness in a range from about 20 Å to about 50 Å. In some embodiments, the seed layer 260A includes tungsten, another suitable material, or a combination thereof. In some embodiments, the seed layer 260A includes a material that is substantially free of fluoride or fluorine. However, embodiments of the disclosure are not limited thereto. In some other embodiments, the seed layer 260A includes a fluorine-containing material.

In some embodiments, the seed layer 260A includes a crystalline material containing grains. The crystalline material may be $SiH_4$ based tungsten, tungsten, tungsten nitride ($WN_x$), tungsten carbide ($WC_x$), another suitable crystalline material, or a combination thereof. In some embodiments, the seed layer 260A includes a polycrystalline material. In some embodiments, the seed layer 260A includes {001}, {111}, and/or {110} crystal orientations.

Many variations and/or modifications can be made to embodiments of the disclosure. In some other embodiments, the seed layer 260A includes an amorphous-like or amorphous material. The amorphous-like or amorphous material may be $B_2H_6$ based tungsten, tungsten, another suitable material, or a combination thereof. In some embodiments, the seed layer 260A includes few grains or substantially no grain in the seed layer 260A.

In accordance with some embodiments, the structure shown in FIGS. 1G and 2B is transferred into in a deposition chamber to deposit the seed layer 260A using an ALD process, another applicable process, or a combination thereof. The formation method of the seed layer 260A is substantially the same as or similar to that of the seed layer 260, and is not repeated.

The deposition of the seed layer 260A may be a crystalline deposition process or an amorphous deposition process. In some embodiments, the deposition of the seed layer 260A is performed at a temperature that is in a range from about 250 degrees C. to about 500 degrees C. In some embodiments, the deposition of the seed layer 260A is performed at a pressure that is in a range from about 3 torr to about 100 torr.

In some embodiments, the precursor source used to deposit the seed layer 260A includes a tungsten-containing material. In some embodiments, the tungsten-containing material is substantially devoid of fluoride or fluorine. In some embodiments, the tungsten-containing material includes a tungsten compound with halogen, another suitable material, or a combination thereof. The tungsten compound with halogen may be tungsten chloride, such as $WCl_5$ or $WCl_6$. Other suitable materials of the tungsten-containing material may include tungsten carbonyl, such as $W(CO)_5$ or $W(CO)_6$, or $W_wC_xH_yN_z$ (where the concentration of tungsten ranges from about 20 at % to about 70 at %, the concentration of carbon ranges from about 0 at % to about 50 at %, the concentration of hydrogen ranges from about 0 at % to about 50 at %, and the concentration of nitrogen ranges from about 20 at % to about 70 at %).

Many variations and/or modifications can be made to embodiments of the disclosure. In some other embodiments, the precursor source used to deposit the seed layer 260A includes a fluorine-containing material. In some embodiments, the fluorine-containing material includes tungsten fluoride ($WF_6$), another suitable material, or a combination thereof.

In some embodiments, the precursor source used to deposit the seed layer 260A is heated to a temperature so as to produce the gaseous precursor 262. In some embodiments, the temperature is in a range from about room temperature to about 200 degrees C. or from about 50 degrees C. to about 200 degrees C. In some embodiments, the gaseous precursor 262 is introduced into the deposition chamber by a carrier gas. In some embodiments, the carrier gas includes Ar, He, $N_2$, another suitable gas, or a combination thereof.

In some embodiments, the reactant 264 used to deposit the seed layer 260A is a reduction agent or a reduction gas. The reactant 264 includes a hydrogen-containing material, another suitable reactant, or a combination thereof. In some embodiments, the reactant 264 for a crystalline deposition process includes $H_2$, $NH_3$, $SiH_4$, another suitable reactant, or a combination thereof. In some other embodiments, the reactant 264 for an amorphous deposition process includes $B_2H_6$, another suitable reactant, or a combination thereof.

Figure 4B:
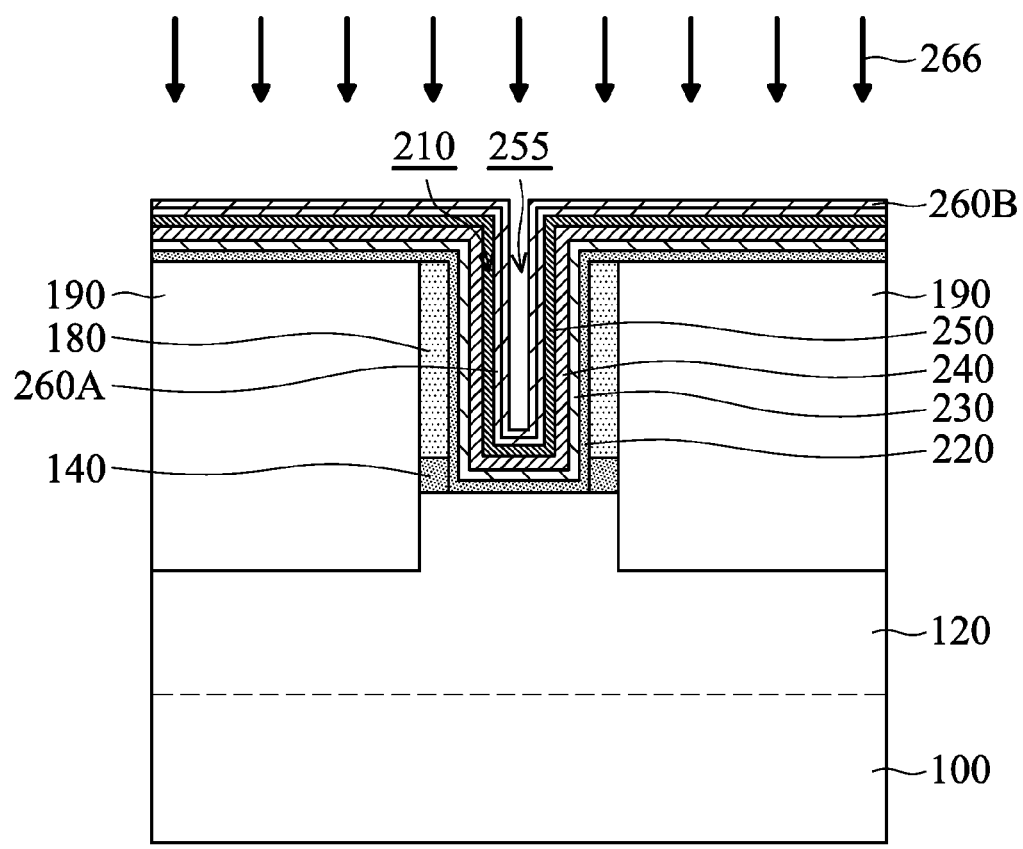

As shown in FIG. 4B, a seed layer 260B is deposited over the seed layer 260A, in accordance with some embodiments. In some embodiments, the seed layer 260B fills the gap 255 in the trench 210. In some embodiments, the seed layer 260B extends over the sidewalls and the bottom of the trench 210 conformally. In some embodiments, the seed layer 260B fills the gap 115 in one of the recesses 110.

In some embodiments, the seed layer 260B has a thickness in a range from about 20 Å to about 50 Å. Although FIG. 4B shows that the thickness of the seed layer 260 is substantially equal to that of the seed layer 260A, embodiments of the disclosure are not limited thereto. In some other embodiments, the thickness of the seed layer 260 is less or greater than that of the seed layer 260A. The thickness of the seed layer 260A and/or the seed layer 260B can be varied according to requirements.

In some embodiments, the seed layer 260B includes tungsten, another suitable material, or a combination thereof. In some embodiments, the seed layer 260B includes a material that is substantially free of fluoride or fluorine. In these embodiments, the seed layer 260A contains fluorine or is substantially free of fluoride or fluorine. However, embodiments of the disclosure are not limited thereto. In some other embodiments, the seed layer 260B includes a fluorine-containing material. In these embodiments, the seed layer 260A contains fluorine or is substantially free of fluoride or fluorine. The seed layer 260A and the seed layer 260B may or may not include substantially the same material.

In some embodiments, the seed layer 260B includes an amorphous-like or amorphous material. In these embodiments, the seed layer 260A includes a crystalline material or an amorphous-like or amorphous material. The amorphous-like or amorphous material may be $B_2H_6$ based tungsten, tungsten, another suitable material, or a combination thereof. In some embodiments, the seed layer 260B includes few grains or substantially no grain in the seed layer 260B.

Many variations and/or modifications can be made to embodiments of the disclosure. In some other embodiments, the seed layer 260B includes a crystalline material containing grains. In these embodiments, the seed layer 260A includes a crystalline material or an amorphous-like or amorphous material. The crystalline material may be $SiH_4$ based tungsten, tungsten, tungsten nitride, tungsten carbide, another suitable crystalline material, or a combination thereof. In some embodiments, the seed layer 260B includes a polycrystalline material. In some embodiments, the seed layer 260B includes {001}, {111}, and/or {110} crystal orientations.

In accordance with some embodiments, the structure shown in FIG. 4A is transferred into in a deposition chamber to deposit the seed layer 260B using an ALD process, another applicable process, or a combination thereof. The formation method of the seed layer 260B is substantially the same as or similar to that of the seed layer 260, and is not repeated.

The deposition of the seed layer 260B may be a crystalline deposition process or an amorphous deposition process. In some embodiments, the deposition of the seed layer 260B is performed at a temperature that is in a range from about 250 degrees C. to about 500 degrees C. In some embodiments, the deposition of the seed layer 260B is performed at a pressure that is in a range from about 3 torr to about 100 torr.

In some embodiments, the precursor source used to deposit the seed layer 260B includes a tungsten-containing material. In some embodiments, the tungsten-containing material is substantially devoid of fluoride or fluorine. In some embodiments, the tungsten-containing material includes a tungsten compound with halogen, another suitable material, or a combination thereof. The tungsten compound with halogen may be tungsten chloride, such as $WCl_5$ or $WCl_6$. Other suitable materials of the tungsten-containing material may include tungsten carbonyl, such as $W(CO)_5$ or $W(CO)_6$, or $W_wC_xH_yN_z$ (where the concentration of tungsten ranges from about 20 at % to about 70 at %, the concentration of carbon ranges from about 0 at % to about 50 at %, the concentration of hydrogen ranges from about 0 at % to about 50 at %, and the concentration of nitrogen ranges from about 20 at % to about 70 at %).

Many variations and/or modifications can be made to embodiments of the disclosure. In some other embodiments, the precursor source used to deposit the seed layer 260B includes a fluorine-containing material. In some embodiments, the fluorine-containing material includes tungsten fluoride ($WF_6$), another suitable material, or a combination thereof. The precursor source used to deposit the seed layer 260B may or may not be substantially the same as that used to deposit the seed layer 260A.

In some embodiments, the precursor source used to deposit the seed layer 260B is heated to a temperature so as to produce the gaseous precursor 262. In some embodiments, the temperature is in a range from about room temperature to about 200 degrees C. or from about 50 degrees C. to about 200 degrees C. In some embodiments, the gaseous precursor 262 is introduced into the deposition chamber by a carrier gas. In some embodiments, the carrier gas includes Ar, He, $N_2$, another suitable gas, or a combination thereof.

In some embodiments, the reactant 264 used to deposit the seed layer 260B is a reduction agent or a reduction gas. The reactant 264 includes a hydrogen-containing material, another suitable reactant, or a combination thereof. In some embodiments, the reactant 264 for a crystalline deposition process includes $H_2$, $NH_3$, $SiH_4$, another suitable reactant, or a combination thereof. In some other embodiments, the reactant 264 for an amorphous deposition process includes $B_2H_6$, another suitable reactant, or a combination thereof. The reactant 264 used to deposit the seed layer 260B may or may not be substantially the same as that used to deposit the seed layer 260A.

In some embodiments, there is an interface between the seed layer 260A and the seed layer 260B. The interface may be observed using an electron microscope such as a transmission electron microscope (TEM). For example, in some embodiments, the seed layer 260A includes a crystalline material and the seed layer 260B includes an amorphous material. The interface between the crystalline material and the amorphous material is detectable.

In some embodiments, a barrier is constructed between the seed layer 260A and the seed layer 260B. For example, heterogeneous materials and/or different crystalline phases between the seed layer 260A and the seed layer 260B may form a strong barrier. As a result, fluorine diffusion from the seed layer 260B and/or the subsequently formed metal filling layer 270 (shown in FIG. 4C) into the work function layer 240 is mitigated or eliminated.

In some embodiments, less fluorine is diffused into the work function layer 240 due to the barrier between the seed layer 260A and the seed layer 260B. Accordingly, the shift in the threshold voltage of the semiconductor device structure, which may be a result of fluorine diffusion into the work function layer 240, is greatly reduced.

In some embodiments, substantially no fluorine diffusion from the seed layer 260B and/or the subsequently formed metal filling layer 270 into the work function layer 240. Accordingly, the threshold voltage stays stable during fabrication processes.

The amount of fluorine diffused into the work function layer 240 can be fine-tuned according to the thicknesses and/or material of the seed layer 260A and the seed layer 260B. Therefore, threshold voltage and/or flat-band voltage of the semiconductor device structure become tunable according to requirements.

For example, in some embodiments, the seed layer 260A including a crystalline material is thicker than the seed layer 260B including an amorphous material. As a result, little or substantially no fluorine is diffused into the work function layer 240. The increase of the threshold voltage is mitigated or prevented. Accordingly, the shift in the threshold voltage is reduced or eliminated.

On the other hand, in some embodiments, the seed layer 260A including a crystalline material is thinner than the seed layer 260B including an amorphous material. As a result, a little fluorine is diffused into the work function layer 240. Consequently, the threshold voltage is increased. The threshold voltage can be increased according to requirements.

The atomic concentration of fluorine in the work function layer 240 can be measured by spectroscopy. The spectroscopy may be XPS or another suitable type of spectroscopy. In some embodiments, the atomic concentration of fluorine in the work function layer 240 in a range from about 0 at % to about 1 at %, but embodiments of the disclosure are not limited thereto.

Figure 4C:
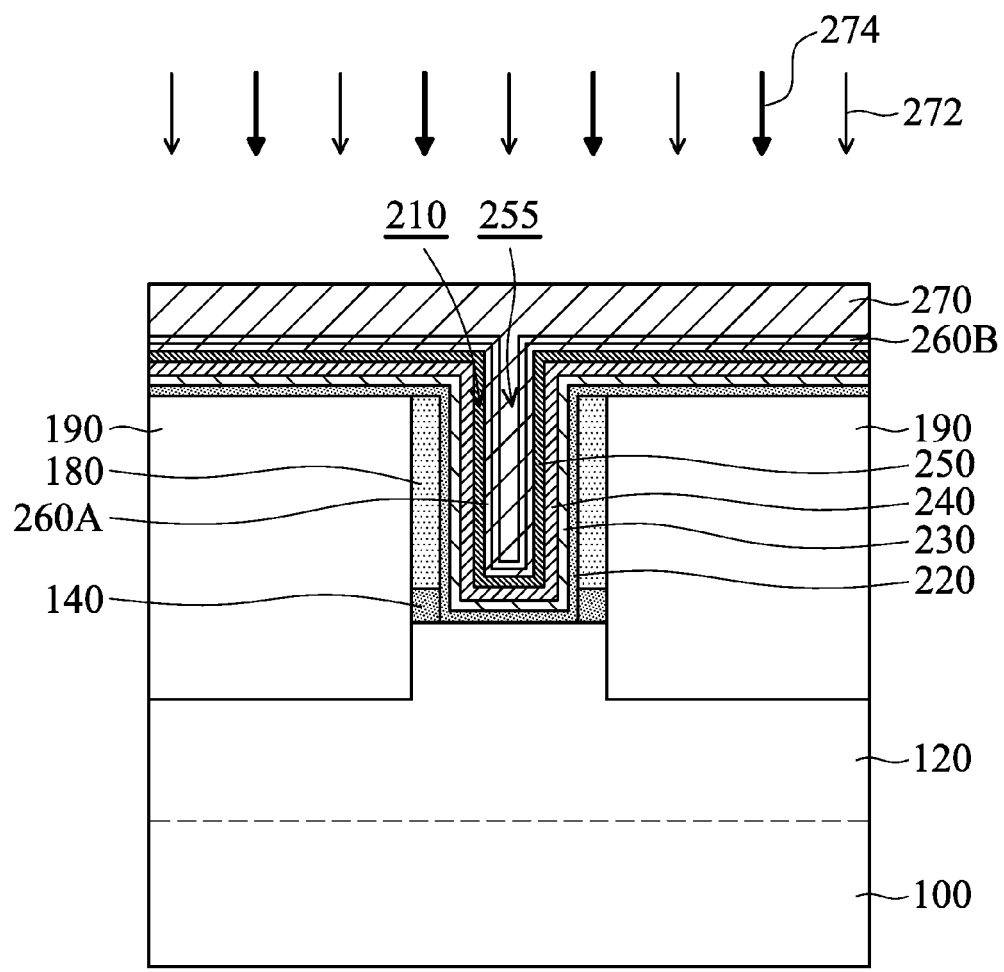

As shown in FIG. 4C, the metal filling layer 270 is deposited over the seed layer 260A and the seed layer 260B to fill up the trench 210, in accordance with some embodiments. In some embodiments, the seed layer 260A, the seed layer 260B and the metal filling layer 270 together form a tungsten bulk layer.

In some embodiments, the metal filling layer 270 is deposited on the seed layer 260B including an amorphous material. The metal filling layer 270 deposited on the amorphous material shows good gap-filling performance. As a result, the gap 255 in the trench 210 and the gap 115 in one of the recesses 110 are well-filled with the metal filling layer 270.

In some embodiments, there is an interface between the metal filling layer 270 and the seed layer 260B. The interface may be observed using an electron microscope such as a TEM. For example, in some embodiments, the metal filling layer 270 includes a crystalline material and the seed layer 260B includes an amorphous material. The interface between the crystalline material and the amorphous material is detectable.

A barrier may be constructed between the metal filling layer 270 and the seed layer 260B. For example, heterogeneous materials and/or different crystalline phases between the metal filling layer 270 and the seed layer 260B may form a barrier. As a result, fluorine diffusion from the metal filling layer 270 into the work function layer 240 is mitigated or eliminated even further.

Figure 4D:
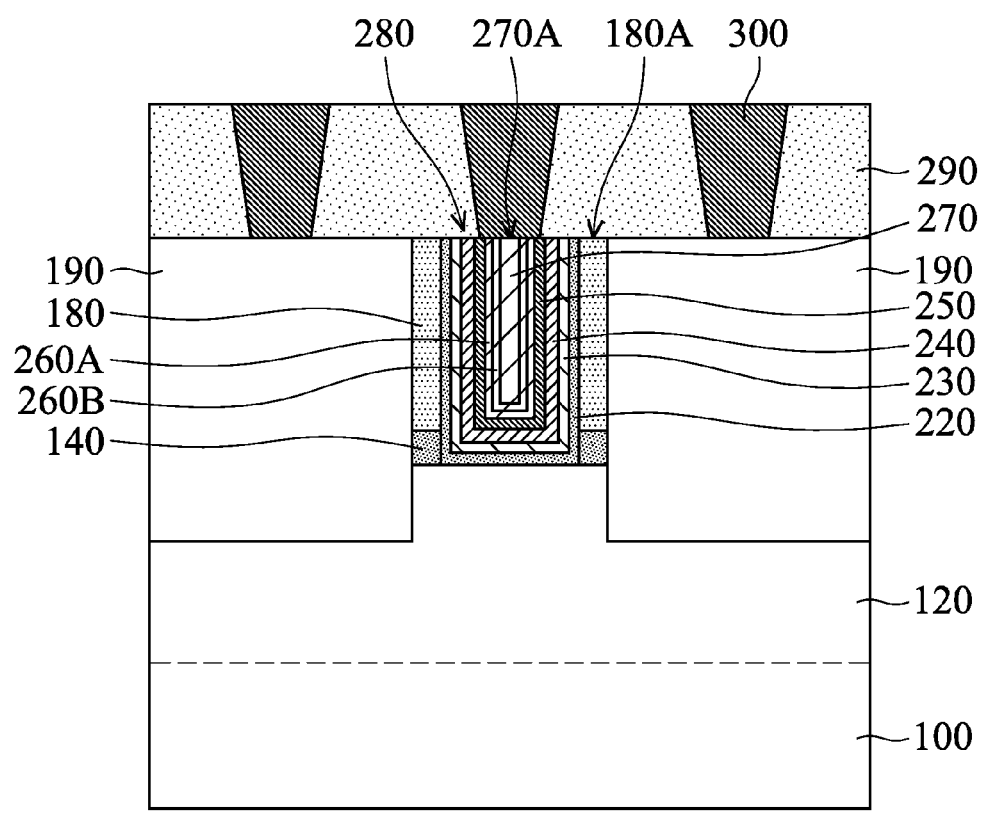

As shown in FIG. 4D, the processes for forming the semiconductor device structure shown in FIG. 2F are performed over the semiconductor device structure shown in FIG. 4C. As a result, the capping layer 230, the work function layer 240, the glue layer 250, the seed layer 260A, the seed layer 260B and the metal filling layer 270 remaining in the trench 210 together form a metal gate stack structure 280". The metal gate stack structure 280" and the gate dielectric layer 220 remaining in the trench 210 together form a gate stack. Afterwards, the dielectric layer 290 is deposited over the dielectric layer 205 and the metal gate stack structure 280". The conductive contacts 300 are formed in the dielectric layer 290 to electrically connect to the metal gate stack structure 280" and the source or drain structures 190.

Subsequently, various features will be formed over the dielectric layer 290 and the conductive contacts 300 shown in FIG. 4D. Some of the various features are electrically connected to the metal gate stack structure 280" and the source or drain structures 190 through the conductive contacts 300. The various features may include interconnection layers, vias and other suitable features.

In some embodiments, the semiconductor device structure includes multiple metal gate stack structures, and each of the metal gate stack structures includes one or more than one seed layer. Many variations and/or modifications can be made to embodiments of the disclosure. In some other embodiments, one of the metal gate stack structures includes more than one seed layer while another of the metal gate stack structures includes one seed layer. For example, a semiconductor device structure may include multiple metal gate stack structures including the metal gate stack structure 280" shown in FIG. 4D and the metal gate stack structure 280 shown in FIG. 2F.

In some embodiments, the metal gate stack structure 280" including the seed layer 260A and the seed layer 260B provides an additional barrier for blocking fluorine. As a result, the amount of fluorine diffused into the work function layer 240 of the metal gate stack structure 280" may be less than the amount of fluorine diffused into the work function layer 240 of the metal gate stack structure 280. Consequently, multiple transistors of the semiconductor device have different variations of threshold voltage and/or flat-band voltage due to different amounts of fluorine diffusion. The threshold voltage and/or flat-band voltage of each transistor can be fine-tuned according to requirements.

Embodiments of the disclosure can be applied to not only a semiconductor device structure with FinFETs but also a semiconductor device structure with planar FETs. In some embodiments, the materials and/or formation methods of a semiconductor device structure with planar FETs are similar to those of the described semiconductor device structure with FinFETs.

Furthermore, embodiments of the disclosure can be applied to not only a semiconductor device structure with N-type or P-type transistors but also a semiconductor device structure with complementary transistors. Embodiments of the disclosure are not limited and may be applied to fabrication processes for any suitable gate structure.

Embodiments of the disclosure are not limited and may be applied to fabrication processes for any suitable technology generation. Various technology generations include a 16 nm node, a 10 nm node, a 7 nm node, a 5 nm node, or another suitable node.

Embodiments of the disclosure form a semiconductor device structure with a low resistance metal gate stack. The metal gate stack includes a work function layer and a gate-filling layer that includes tungsten and substantially excludes fluoride or fluorine. Due to the fluorine-free gate-filling layer, fluorine diffusion from the gate-filling layer into the work function layer is substantially forbidden. As a result, variations in threshold voltage and/or flat-band voltage during fabrication processes are effectively reduced or eliminated. It can be ensured that threshold voltage and flat-band voltage are accurately controlled. Therefore, the device performance and reliability of the semiconductor device structure is significantly enhanced.

In addition, the metal gate stack includes more than one seed layer for depositing the gate-filling layer. Since heterogeneous crystalline phases between two seed layers form a barrier for blocking fluorine, fluorine diffusion into the work function layer is greatly mitigated or eliminated. The amount of fluorine diffused into the work function layer can be adjusted according to the thicknesses and/or material of the seed layers. Therefore, the threshold voltage and/or flat-band voltage of the semiconductor device structure are tunable according to requirements.

In accordance with some embodiments, a method for forming a semiconductor device structure is provided. The method includes patterning a semiconductor substrate to form a fin structure. The method also includes forming a sacrificial material over the fin structure. The method further includes forming spacer elements adjoining sidewalls of the sacrificial material. Furthermore, the method includes removing the sacrificial material so that a trench is formed between the spacer elements. The method also includes forming a gate dielectric layer in the trench. The method further includes forming a work function layer in the trench to cover the gate dielectric layer. In addition, the method includes depositing a tungsten bulk layer with a precursor to fill the trench. The precursor includes a tungsten-containing material that is substantially free of fluoride.

In accordance with some embodiments, a method for forming a semiconductor device structure is provided. The method includes patterning a semiconductor substrate to form a fin structure. The method also includes forming spacer elements covering the fin structure. There is a trench between the spacer elements. The method further includes forming a gate dielectric layer in the trench. In addition, the method includes forming a work function layer in the trench to cover the gate dielectric layer. The method also includes depositing a first seed layer in the trench to cover the work function layer. The method further includes depositing a second seed layer in the trench to cover the first seed layer. There is a heterogeneous crystalline phase between the first seed layer and the second seed layer. Furthermore, the method includes depositing a tungsten-containing layer to cover the second seed layer and fill up the trench. There is substantially no fluorine-containing plasma applied to the first tungsten-containing layer during the deposition of the second tungsten-containing layer.

In accordance with some embodiments, a semiconductor device structure is provided. The semiconductor device structure includes a semiconductor substrate. The semiconductor device structure also includes a fin structure over the semiconductor substrate. The semiconductor device structure further includes spacer elements over the fin structure. In addition, the semiconductor device structure includes a gate dielectric layer between the spacer elements. The gate dielectric layer covers a portion of the fin structure and sidewalls of the spacer elements. The semiconductor device structure also includes a work function layer between the spacer elements. The work function layer covers the gate dielectric layer. The semiconductor device structure further includes a tungsten bulk layer between the spacer elements. The tungsten bulk layer is surrounded by the work function layer and the gate dielectric layer. The tungsten bulk layer is substantially free of fluorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    patterning a semiconductor substrate to form a fin structure;
    forming a sacrificial material over the fin structure;
    forming spacer elements adjoining sidewalls of the sacrificial material;
    removing the sacrificial material so that a trench is formed between the spacer elements;
    forming a gate dielectric layer in the trench;
    forming a work function layer in the trench to cover the gate dielectric layer;
    depositing a first seed layer over the work function layer in the trench, wherein the first seed layer comprises an amorphous-like or amorphous material; and
    depositing a tungsten bulk layer with a precursor to fill the trench, wherein the precursor comprises a tungsten-containing crystalline material substantially free of fluoride.

2. The method for forming a semiconductor device structure as claimed in claim 1, wherein the precursor comprises tungsten chloride, tungsten carbonyl, or a combination thereof.

3. The method for forming a semiconductor device structure as claimed in claim 1, wherein the deposition of the tungsten bulk layer comprises a non-plasma chemical vapor deposition process.

4. The method for forming a semiconductor device structure as claimed in claim 1, wherein the deposition of the tungsten bulk layer comprises reacting the precursor with a reduction gas that comprises a hydrogen-containing material.

5. The method for forming a semiconductor device structure as claimed in claim 1,
    wherein a second precursor used during the deposition of the first seed layer comprises a second tungsten-containing material substantially free of fluoride.

6. The method for forming a semiconductor device structure as claimed in claim 5, wherein the deposition of the first seed layer comprises a non-plasma atomic layer deposition process.

7. The method for forming a semiconductor device structure as claimed in claim 1, further comprising:
    forming a second seed layer over the work function layer in the trench before the deposition of the tungsten bulk layer, wherein the second seed layer comprises a crystalline material.

8. The method for forming a semiconductor device structure as claimed in claim 1,
    wherein the first seed layer is deposited in the trench with a first reduction agent before the deposition of the tungsten bulk layer, and wherein the method further comprises:
    forming a second seed layer in the trench with a second reduction agent before the deposition of the tungsten bulk layer, wherein the second reduction agent is different from the first reduction agent.

9. A method for forming a semiconductor device structure, comprising:
    patterning a semiconductor substrate to form a fin structure;
    forming spacer elements covering the fin structure, wherein there is a trench between the spacer elements;
    forming a gate dielectric layer in the trench;
    forming a work function layer in the trench to cover the gate dielectric layer;
    depositing a first seed layer in the trench to cover the work function layer;
    depositing a second seed layer in the trench to cover the first seed layer, wherein there is a heterogeneous crystalline phase between the first seed layer and the second seed layer; and
    depositing a tungsten-containing layer to cover the second seed layer and fill up the trench.

10. The method for forming a semiconductor device structure as claimed in claim 9, wherein the deposition of the tungsten-containing layer comprises introducing a gas substantially free of fluorine and carbon to the second seed layer.

11. The method for forming a semiconductor device structure as claimed in claim 9, wherein the deposition of the tungsten-containing layer comprises reacting a tungsten-containing precursor with a reduction gas, and wherein the tungsten-containing precursor and the reduction gas are substantially free of plasma.

12. The method for forming a semiconductor device structure as claimed in claim 9, wherein the first seed layer or the second seed layer is deposited with a precursor, and wherein the precursor comprises a tungsten-containing material substantially free of fluoride.

13. The method for forming a semiconductor device structure as claimed in claim 9, wherein the deposition of the first seed layer or the second seed layer comprises a non-plasma atomic layer deposition process, and the deposition of the tungsten-containing layer comprises a non-plasma chemical vapor deposition process.

14. The method for forming a semiconductor device structure as claimed in claim 9, wherein the deposition of the first seed layer comprises a crystalline deposition process, and the deposition of the second seed layer comprises a an amorphous deposition process.

15. The method for forming a semiconductor device structure as claimed in claim 9, wherein the deposition of the first seed layer comprises introducing a first hydrogen-containing material, and the deposition of the second seed layer comprises introducing a second hydrogen-containing material, and wherein the second hydrogen-containing material is different from the first hydrogen-containing material.

16. A semiconductor device structure, comprising:
a semiconductor substrate;
a fin structure over the semiconductor substrate;
spacer elements over the fin structure;
a gate dielectric layer between the spacer elements, wherein the gate dielectric layer covers a portion of the fin structure and sidewalls of the spacer elements;
a work function layer between the spacer elements, wherein the work function layer covers the gate dielectric layer;
a tungsten bulk layer between the spacer elements, wherein the tungsten bulk layer is surrounded by the work function layer and the gate dielectric layer, and the tungsten bulk layer comprises a crystalline material substantially free of fluorine; and
a first tungsten seed layer between the tungsten bulk layer and the work function layer, wherein the first tungsten seed layer comprises an amorphous-like or amorphous material.

17. The semiconductor device structure as claimed in claim 16, wherein the tungsten bulk layer comprises chlorine.

18. The semiconductor device structure as claimed in claim 16, wherein the tungsten bulk layer is substantially free of carbon.

19. The semiconductor device structure as claimed in claim 16,
wherein the first tungsten seed layer is substantially free of fluorine and carbon.

20. The semiconductor device structure as claimed in claim 16, further comprising:
a second tungsten seed layer between the tungsten bulk layer and the work function layer, wherein there is a heterogeneous crystalline phase between the first tungsten seed layer and the second tungsten seed layer.

* * * * *